(12) United States Patent
Chern et al.

(10) Patent No.: US 9,755,640 B2
(45) Date of Patent: Sep. 5, 2017

(54) RESISTIVE INPUT SYSTEM WITH RESISTOR MATRIX

(71) Applicant: UNIVERSAL CEMENT CORPORATION, Taipei (TW)

(72) Inventors: Yann-Cherng Chern, New Taipei (TW); Chih-Sheng Hou, Taipei (TW); Chih-Hung Huang, New Taipei (TW)

(73) Assignee: UNIVERSAL CLEMENT CORPORATION, Taipei (TW)

( * ) Notice: Subject to any disclaimer, the term of this patent is extended or adjusted under 35 U.S.C. 154(b) by 109 days.

(21) Appl. No.: 14/825,847

(22) Filed: Aug. 13, 2015

(65) Prior Publication Data
US 2015/0349774 A1 Dec. 3, 2015

Related U.S. Application Data

(63) Continuation-in-part of application No. 14/147,568, filed on Jan. 5, 2014, now Pat. No. 9,164,643.

(60) Provisional application No. 61/749,925, filed on Jan. 8, 2013.

(51) Int. Cl.
*G01L 1/22* (2006.01)
*H03K 17/96* (2006.01)
*G06F 3/045* (2006.01)

(52) U.S. Cl.
CPC ......... *H03K 17/9645* (2013.01); *G06F 3/045* (2013.01); *H03K 17/9625* (2013.01)

(58) Field of Classification Search
CPC . H03K 17/9645; H03K 17/9625; G06F 3/045
USPC ..................... 73/862.041–862.046
See application file for complete search history.

(56) References Cited

U.S. PATENT DOCUMENTS

| 6,225,986 | B1 | 5/2001 | Sato et al. | |
|---|---|---|---|---|
| 6,259,644 | B1* | 7/2001 | Tran | B82Y 10/00 |
| | | | | 257/E21.665 |
| 7,505,347 | B2 | 3/2009 | Rinerson et al. | |
| 7,554,531 | B2 | 6/2009 | Baker et al. | |
| 7,873,119 | B2 | 1/2011 | Chan et al. | |
| 8,648,610 | B2 | 2/2014 | Mikami et al. | |
| 2002/0175835 | A1* | 11/2002 | Falik | H03M 11/20 |
| | | | | 341/26 |
| 2006/0227078 | A1* | 10/2006 | Shino | G09G 3/2092 |
| | | | | 345/75.2 |
| 2011/0309956 | A1* | 12/2011 | Westhues | H03M 11/20 |
| | | | | 341/22 |

(Continued)

*Primary Examiner* — Max Noori
(74) *Attorney, Agent, or Firm* — Muncy, Geissler, Olds & Lowe, P.C.

(57) ABSTRACT

A resistive input system is disclosed, which includes a resistor matrix. The resistor matrix includes M first traces, N second traces, and M*N resistors. First ends of the resistors of a same column are coupled to one of the M first traces, second ends of the resistors of a same row are coupled to one of the N second traces, M is integers greater than 1, and N is integers greater than and equal to 1. The M*N resistors include variable resistors. A measurement circuit measures variations of a first voltage level of each of the second traces while a power control circuit provides the first voltage to the one of the M first traces and the second voltage to the rest of the M first traces. At least one input point is determined according to the variation of the first voltage level of each of the second traces.

20 Claims, 25 Drawing Sheets

(56) References Cited

U.S. PATENT DOCUMENTS

2014/0118014 A1\* 5/2014 Orr ..................... G01R 27/16
324/713

\* cited by examiner

RESISTIVE INPUT SYSTEM WITH RESISTOR MATRIX

CROSS-REFERENCE TO RELATED APPLICATION

This application is a continuation-in-part of U.S. patent application Ser. No. 14/147,568, filed on Jan. 5, 2014, in the United States Patent and Trademark Office, which claims the benefit of U.S. Provisional Application No. 61/749,925, filed on Jan. 8, 2013, in the United States Patent and Trademark Office, the disclosure of which is incorporated herein in their entirety by reference.

BACKGROUND OF THE INVENTION

1. Field of the Invention

The present invention generally relates to a resistive input system, in particular to a resistive input system with resistor matrix.

2. Description of the Related Art

Currently, lots of the input devices apply switch matrix to receive the input signal. When a user touches the type of input device, a switch located at the input point is turned on. Therefore, the location of the input point of the input device could be determined according to the electric signal outputted from one end of the switch to another end of the switch while the power control circuit and measurement circuit scan each switch of the switch matrix.

However, when two or more input points of the type of input device are triggered at the same time, the input device may miscalculate the locations of the input points. For example, when the input device is a touch sensor and the user touches an area around some neighboring switches, those switches may be turned on accordingly. Therefore, when the power control circuit supplies the voltage to the switch matrix, a current may flow from the power control circuit through several switches instead of one switch the switch to the measurement circuit, and thus the input device may misinterpret the area near the touched area as the input point.

SUMMARY OF THE INVENTION

Therefore, it is a primary objective of the present invention to provide a resistive input system with a resistor matrix to accurately determine the touch point. In addition, information about the magnitude of the input signal can be provided by the resistive input system with a resistor matrix of the present invention as well.

To achieve the foregoing objective, the present invention provides a resistive input system with a resistor matrix. The resistive input system includes a resistor matrix, a first power control circuit, a first measurement circuit, and a processor. The resistor matrix includes M first traces, N second traces, and M*N resistors. First ends of the resistors of a same column are coupled to one of the M first traces, second ends of the resistors of a same row are coupled to one of the N second traces, and M is integers greater than 1, and N is integers greater than and equal to 1. The M*N resistors include variable resistors, and resistances of the variable resistors vary according to an input signal. The first power control circuit is coupled to the M first traces and provides a first voltage to one of the M first traces and a second voltage to the rest of the M first traces. The first measurement circuit is coupled to the N second traces and measures variations of a first voltage level of each of the second traces while the first power control circuit provides the first voltage to the one of the M first traces and the second voltage to the rest of the M first traces. The processor is coupled to the first measurement circuit and determines at least one input point of the resistive input system according to the variation of the first voltage level of each of the second traces.

In a preferred embodiment of the present invention, the first power control circuit may further comprises a voltage adjustment element coupled to the processor, which adjusts at least one of the first voltage and the second voltage according to a controlling signal from the processor to adjust the variations of the first voltage level measured by the first measurement circuit.

In a preferred embodiment of the present invention, the first power control circuit may further comprises a voltage adjustment circuit coupled to the processor, one of the first voltage and the second voltage is inputted into the voltage adjustment circuit to adjust a difference between the first voltage and the second voltage according to a control signal from the processor.

In a preferred embodiment of the present invention, one of the first voltage and the second voltage is inputted into the voltage adjustment circuit to be adjusted to one another according to the control signal from the processor.

In a preferred embodiment of the present invention, the M*N resistors may include N reference resistors and (M−1)*N variable resistors, and each of the second traces is coupled to one of the reference resistors and (M−1) variable resistors of the variable resistors, respectively. The processor determines a magnitude of the input signal according to the variations of the first voltage level and resistance of the reference resistors.

In a preferred embodiment of the present invention, the M*N resistors may include M*N variable resistors. The resistive input system may further include a second power control circuit and a second measurement circuit. The second power control circuit coupled to the N second traces and providing a third voltage to one of the N second traces and a fourth voltage to the rest of the N second traces. The second measurement circuit is coupled to one of the M first trace and the processor and measures variations of the second voltage level of the one of the M first traces while the second power control circuit provides the third voltage to the one of the N second traces and the fourth voltage to the rest of the N second traces. The processor determines ratios of resistance of one variable resistor to that of another variable resistor according to the variations of the first voltage level and the second voltage level, and determines a relative magnitude distribution according to the ratios.

In a preferred embodiment of the present invention, the M*N resistors may include M*N variable resistors. The resistive input system may further include a reference resistor, where a first end of the reference resistor coupled to the first power control circuit, and a second end of the reference resistor coupled to the first measurement circuit. The reference resistor is electrically coupled to one of the second traces measured by the first measurement circuit and isolated from the rest of the second traces. The first power control circuit provides the first voltage to one of the reference resistor and the M first traces and the second voltage to the rest of the reference resistor and the M first traces. The first measurement circuit measures variations of the first voltage level of each of the second traces while the first power control circuit provides the first voltage to one of the reference resistor and the M first traces and the second voltage to the rest of the reference resistor and the M first traces. The processor determines ratios of resistance of the reference resistor to that of each of the variable resistors according to the variations of the first voltage level, and determines a magnitude of the input signal according to the ratios.

In a preferred embodiment of the present invention, the reference resistor and the variable resistors may be made of the same material and a predetermined input signal is applied on the reference resistor.

In a preferred embodiment of the present invention, the resistive input system may further include a selective circuit and a plurality of reference resistors. The selective circuit is coupled to the first power control circuit. The plurality of reference resistors have different resistances, and each of the reference resistors coupled to the selective circuit and the first measurement circuit. The selective circuit selects one of the reference resistors and the selected reference resistor couples the first power control circuit and the first measurement circuit and is isolated from the rest of the second traces. The first power control circuit provides the first voltage to one of the selective circuit and the M first traces and the second voltage to the rest of the selective circuit and the M first traces. The first measurement circuit measures variations of the first voltage level of each of the second traces while the first power control circuit provides the first voltage to one of the selective circuit and the M first traces and the second voltage to the rest of the selective circuit and the M first traces. The processor determines ratios of resistance of the one of the reference resistors to that of each of the variable resistors according to the variations of the first voltage level, and determines a magnitude of the input signal according to the ratios.

In a preferred embodiment of the present invention, the variable resistors may be force sensing resistors (FSR), and the input signal may be touching force.

In a preferred embodiment of the present invention, the first measurement circuit may include a voltage adjustment circuit and an analog-to-digital convertor, the voltage adjustment circuit is coupled to the N second traces and adjusts the first voltage level from the N second traces to a working range for the analog-to-digital convertor, and the analog-to-digital convertor is coupled to the voltage adjustment circuit and converts the adjusted first voltage level to a digital signal for the processor. The voltage adjustment circuit may include an op amp circuit.

In a preferred embodiment, the processor may be coupled to the first power control circuit and the first measurement circuit, and a threshold value may be set in the processor, wherein when a different between the first voltage level and the first voltage is smaller than the threshold voltage, the processor controls the first power circuit and the first measurement circuit to skip the following scanning process on the scanned second trace.

In a preferred embodiment, the first power control circuit, the resistor matrix, and the first measurement circuit may be disposed in a first device, and the processor may be disposed in a second device, which is configured to be communicated with the first device. Those skilled in the art would realize that the data transmission between the first device and the second device may be implemented with wired or wireless transmission, therefore the detail description may be omitted. The first device includes a scanning memory storing a predetermined order and coupled to the first power control circuit and the first measurement circuit, and the first power control circuit and the first measurement circuit scan the resistor matrix in the predetermined order.

As mentioned above, the resistive input system with resistor matrix in accordance with the present invention may have one or more advantages as follows.

1. The resistive input system in accordance with the present invention is able to be used to accurately detect the location the input signal by the variable resistors included in the resistor matrix.

2. The resistive input system in accordance with the present invention is able to be used to determine the magnitude or the relative distribution of the input signal by the calculation process of the processor.

3. The resistive input system in accordance with the present invention is able to neglect environmental effect on the variable resistors by the reference resistor made of the same material as the variable resistors.

4. The resistive input system in accordance with the present invention is able to be used to select appropriate resolution for the input signal by using the selective circuit and the plurality of reference resistors.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

The technical content of the present invention will become apparent by the detailed description of the following embodiments and the illustration of related drawings as follows. The embodiments may be in different forms and should not be construed as limited to the embodiments set forth herein.

The present invention provides a resistive input system with a resistor matrix. The resistive input system includes a resistor matrix, a first power control circuit, a first measurement circuit, and a processor. The resistor matrix includes M first traces, N second traces, and M*N resistors. First ends of the resistors of a same column are coupled to one of the M first traces, second ends of the resistors of a same row are coupled to one of the N second traces, M is integers greater than 1, and N is integers greater than and equal to 1. The M*N resistors include variable resistors, and resistances of the variable resistors vary according to an input signal. The first power control circuit is coupled to the M first traces and provides a first voltage to one of the M first traces and a second voltage to the rest of the M first traces. The first measurement circuit is coupled to the N second traces and measures variations of a first voltage level of each of the second traces while the first power control circuit provides the first voltage to the one of the M first traces and the second voltage to the rest of the M first traces. The processor is coupled to the first measurement circuit and determines at least input point of the resistive input system according to the variation of the first voltage level of each of the second traces. Hereinafter, embodiments of the resistive input systems in accordance with the present invention are described in details.

Figure 1:
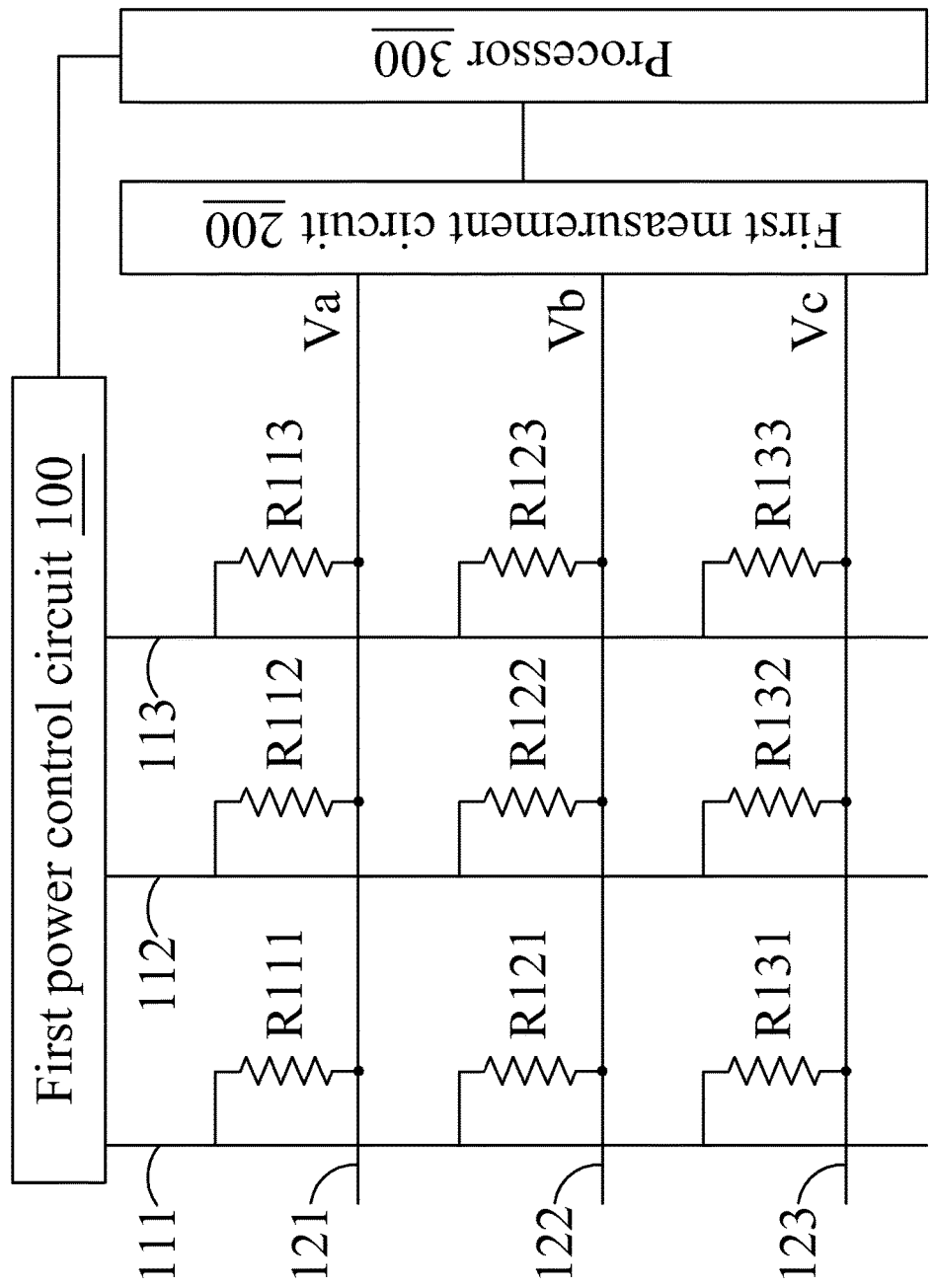
FIG. 1 is a schematic diagram of a resistive input system according to a first embodiment of the present invention.

Please refer to FIG. 1, which is a schematic diagram of a resistive input system according to a first embodiment of the present invention. In FIG. 1, the resistive input system includes a resistor matrix, a first power control circuit 100, a first measurement circuit 200, and a processor 300. The resistor matrix includes 3 first traces 111, 112, and 113, 3 second traces 121, 122, and 123, and 3*3 resistors R111 to R133. It is worth noting that 3*3 resistor matrix described here is for example, the size of the resistor matrix of the input device is not limited thereto, which is also true for other embodiments. In this embodiment, the 3*3 resistors may include 3 reference resistors R111, R121, and R131, and (3−1)*3=6 variable resistors R112, R113, R122, R123, R132, and R133, where each of the second traces is coupled to one of the reference resistors and (3−1)=2 variable resistors of the variable resistors, respectively. The processor 300 determines a magnitude of the input signal according to the variations of the first voltage level and resistance of the reference resistors R111, R121, and R131.

In this embodiment, the resistances of the reference resistors are known, and the variable resistors are used to sense the input signal. Therefore, the location and magnitude of the input signal can be determined by the scanning process of the first power control circuit 100 and the measurement circuit 200 with the calculation process of the processor 300. In particular, the first power control circuit 100 may apply the first voltage V1 to the first traces 111, 112, and 113 in a predetermined sequence, where the predetermined sequence may be 111->112->113, and the first power control circuit 100 may also apply the second voltage V2 to other first traces on which the first voltage V1 is not applied. In this period, the first measurement circuit 200 is coupled to the second traces 121, 122, and 123, and measures the first voltage levels Va, Vb, and Vc on the second traces 121, 122, and 123, respectively.

Figure 2A:
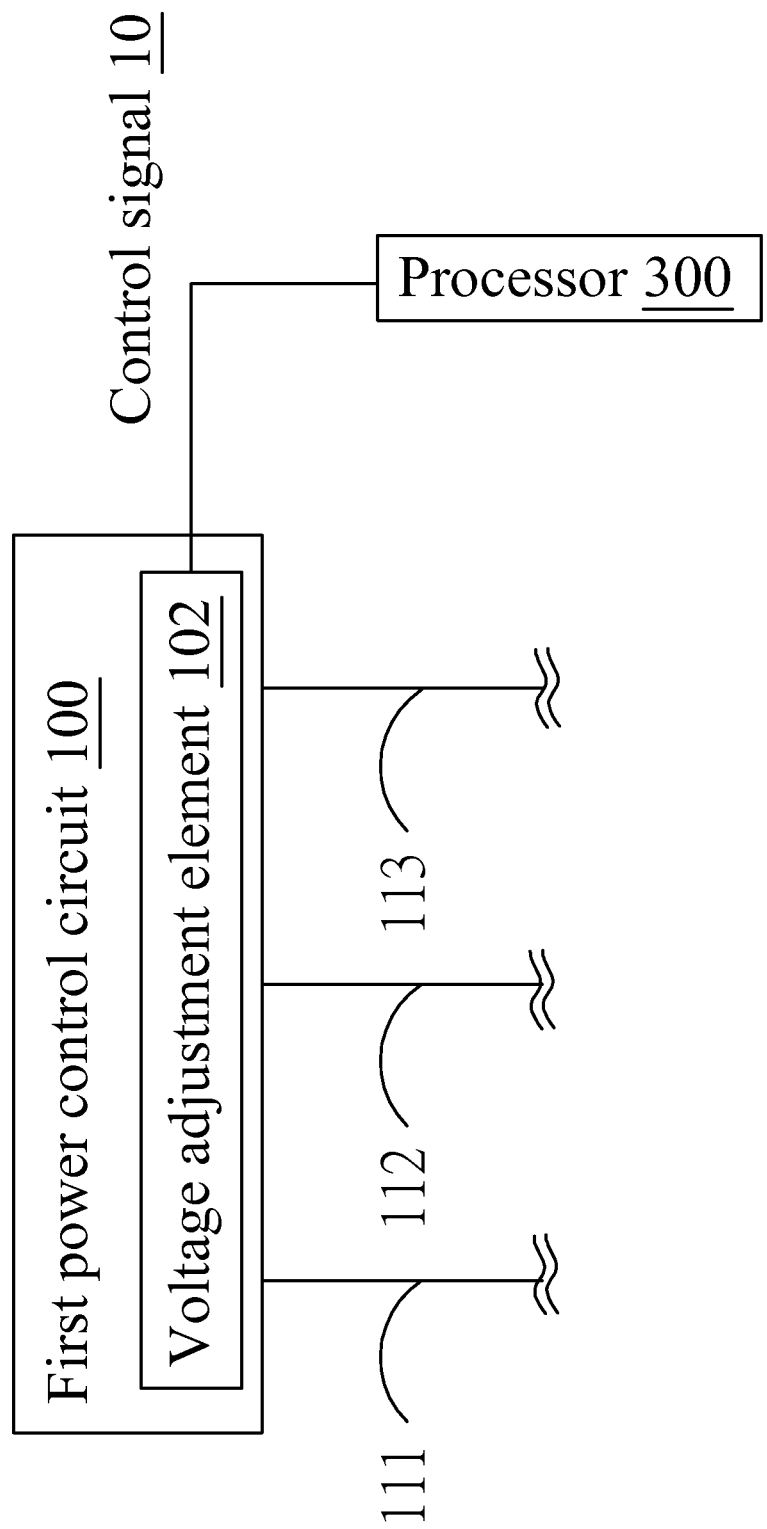
FIGS. 2A-2H are schematic diagrams of the first power control circuit of the resistive input system according to the first embodiment of the present invention
Figure 2B:
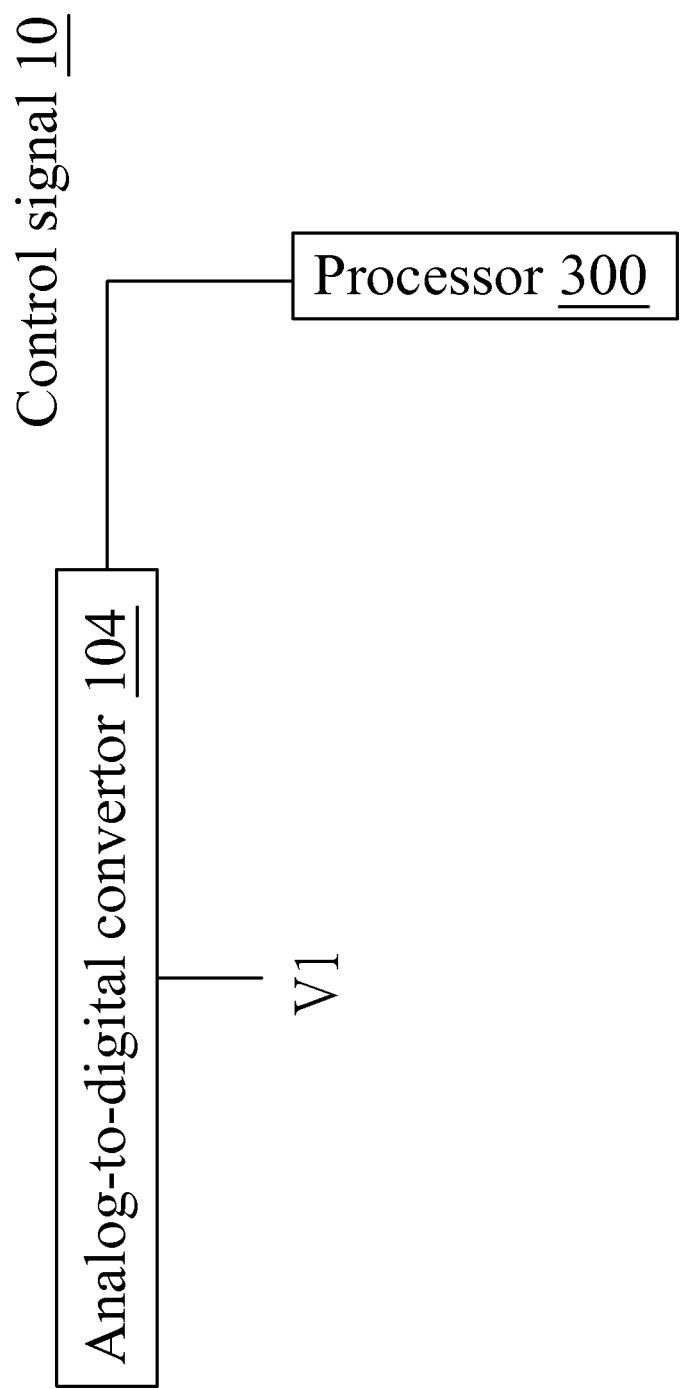
Figure 2C:
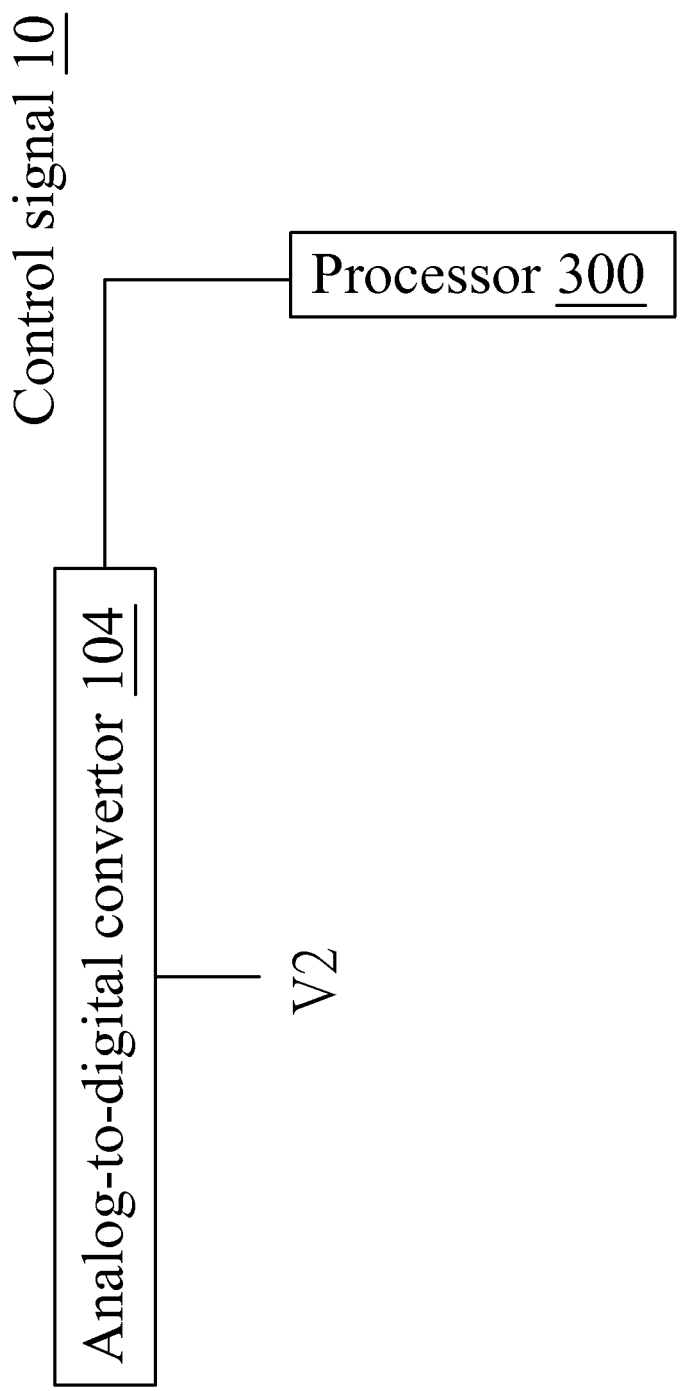
Figure 2D:
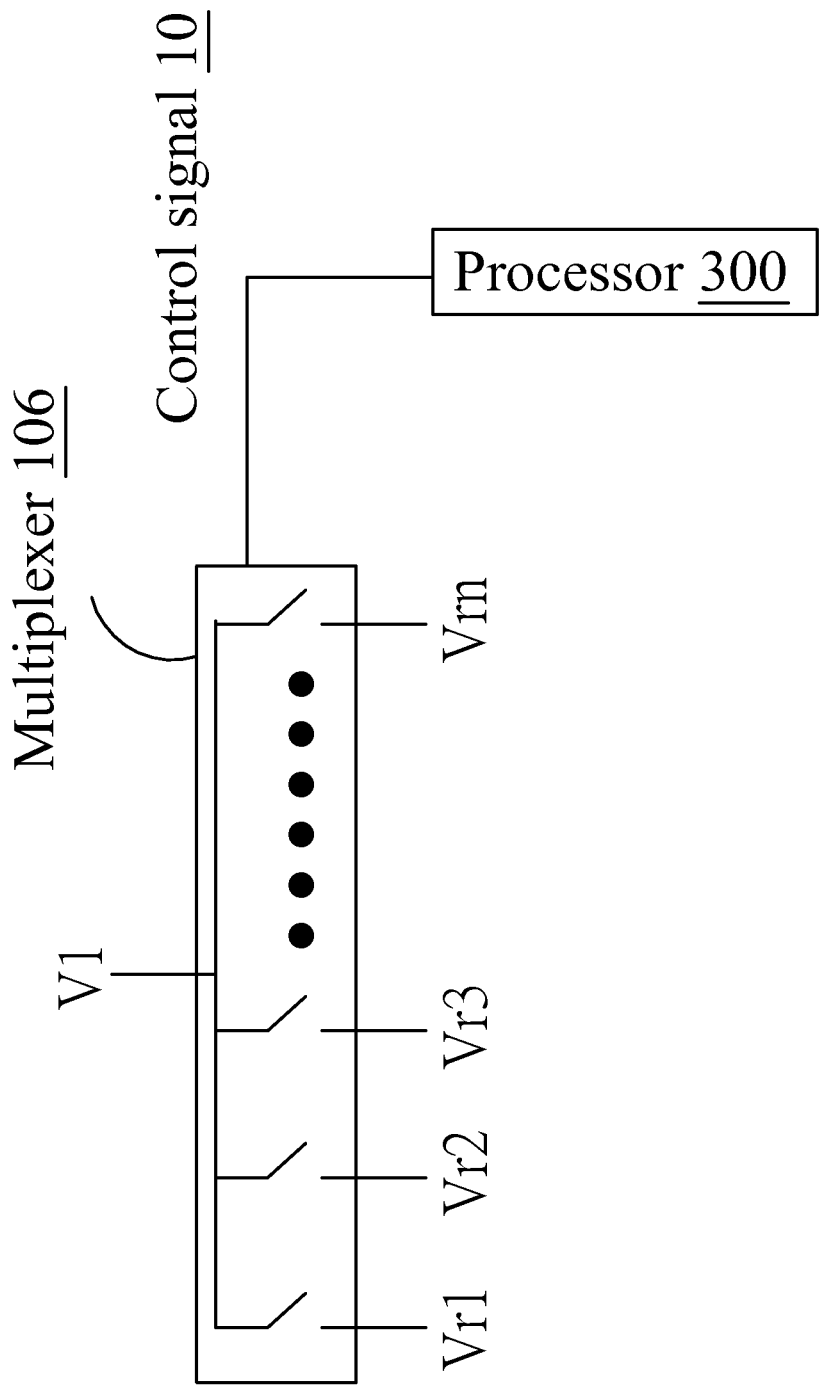
Figure 2E:
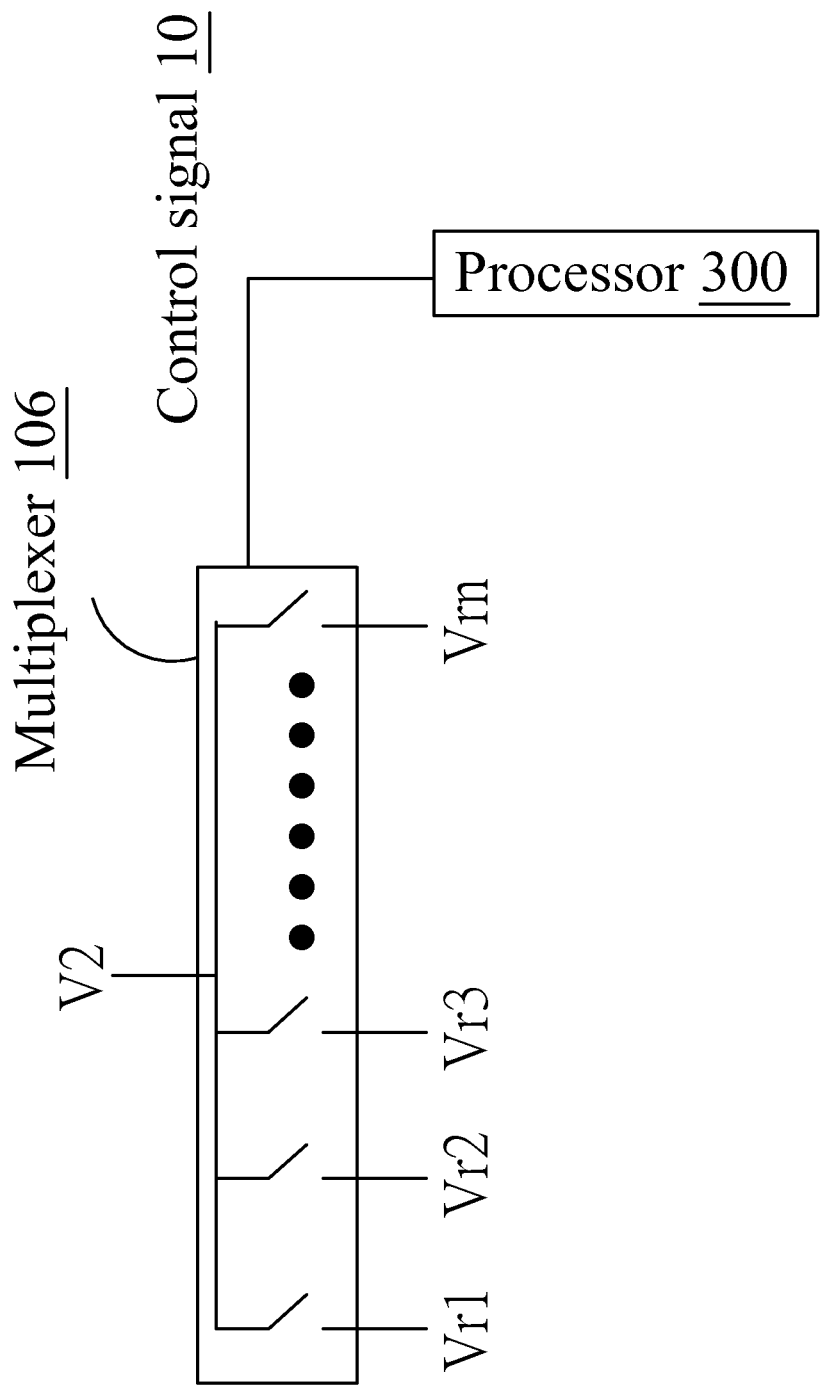

Please refer to FIGS. 2A-2H, which are schematic diagrams of the first power control circuit of the resistive input system according to the first embodiment of the present invention, the first power control circuit 100 may further include a voltage adjustment element 102 coupled to the processor 300, which adjusts at least one of the first voltage V1 and the second voltage V2 according to a control signal 10 from the processor 300 to adjust the variations of the first voltage level measured by the first measurement circuit. Preferably, the voltage adjustment element 102 may be an analog-to-digital convertor 104 for adjusting the magnitudes of the first voltage V1 and/or the second voltage V2, or the voltage adjustment element 102 may be a multiplexer 106 for adjusting the magnitudes of the first voltage V1 and/or the second voltage V2 by selecting from voltage Vr1-Vrn according to the control signal 10 from the processor 300. Afterward, the adjusted first voltage V1 is provided to one of the M first traces and/or the adjusted second voltage V2 is provided to the rest of the M first traces, as shown in FIGS. 2D to 2E. Therefore the first voltage level Va1 measured by the first measurement circuit 200 will be adjusted to a working range for an analog-to-digital convertor, or the current outputted by a "single-pole, double-throw" (SPDT) circuit included therein may be decreased, the analog-to-digital convertor and the SPDT will be described hereinafter.

Figure 2F:
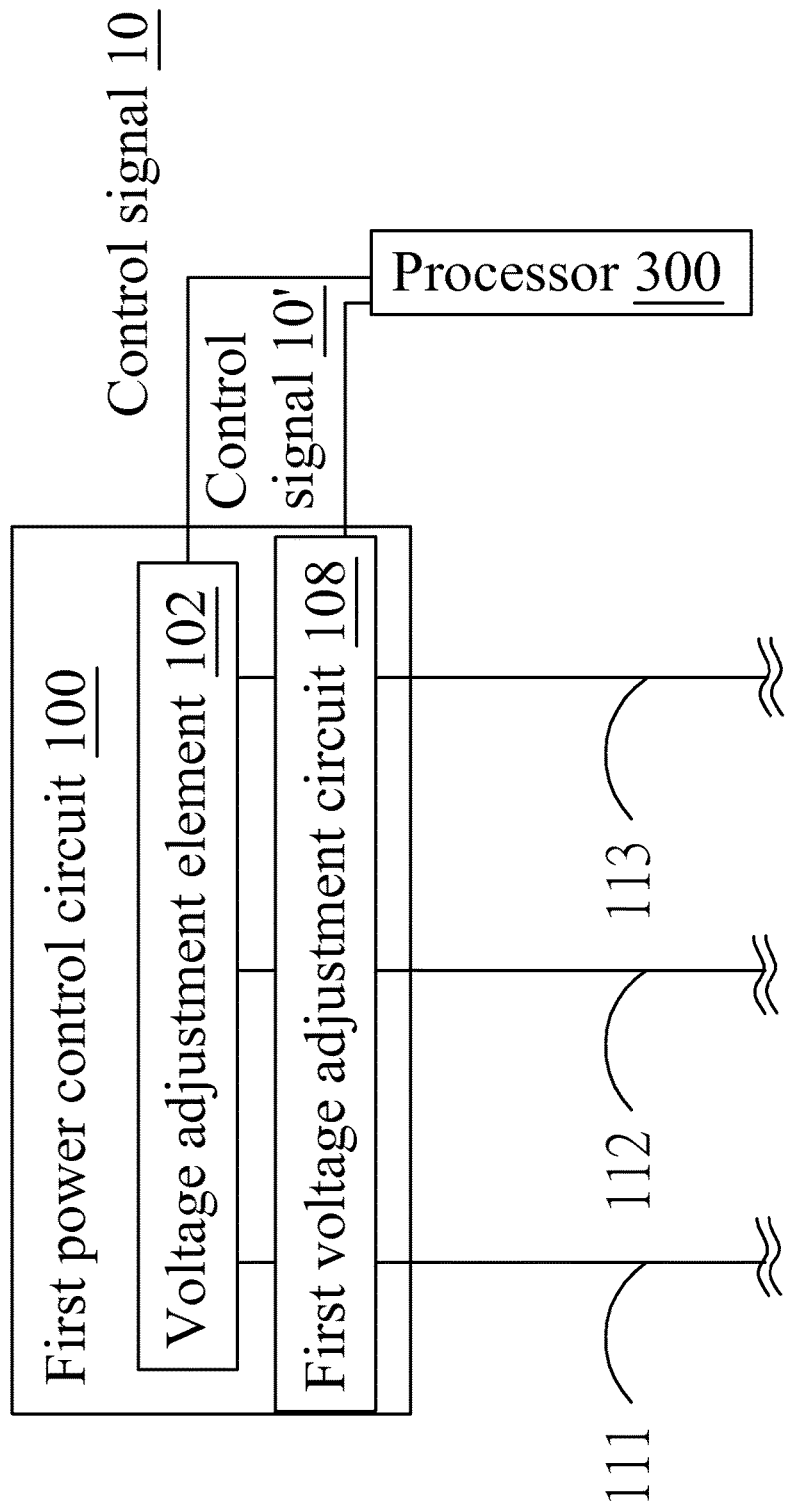
Figure 2G:
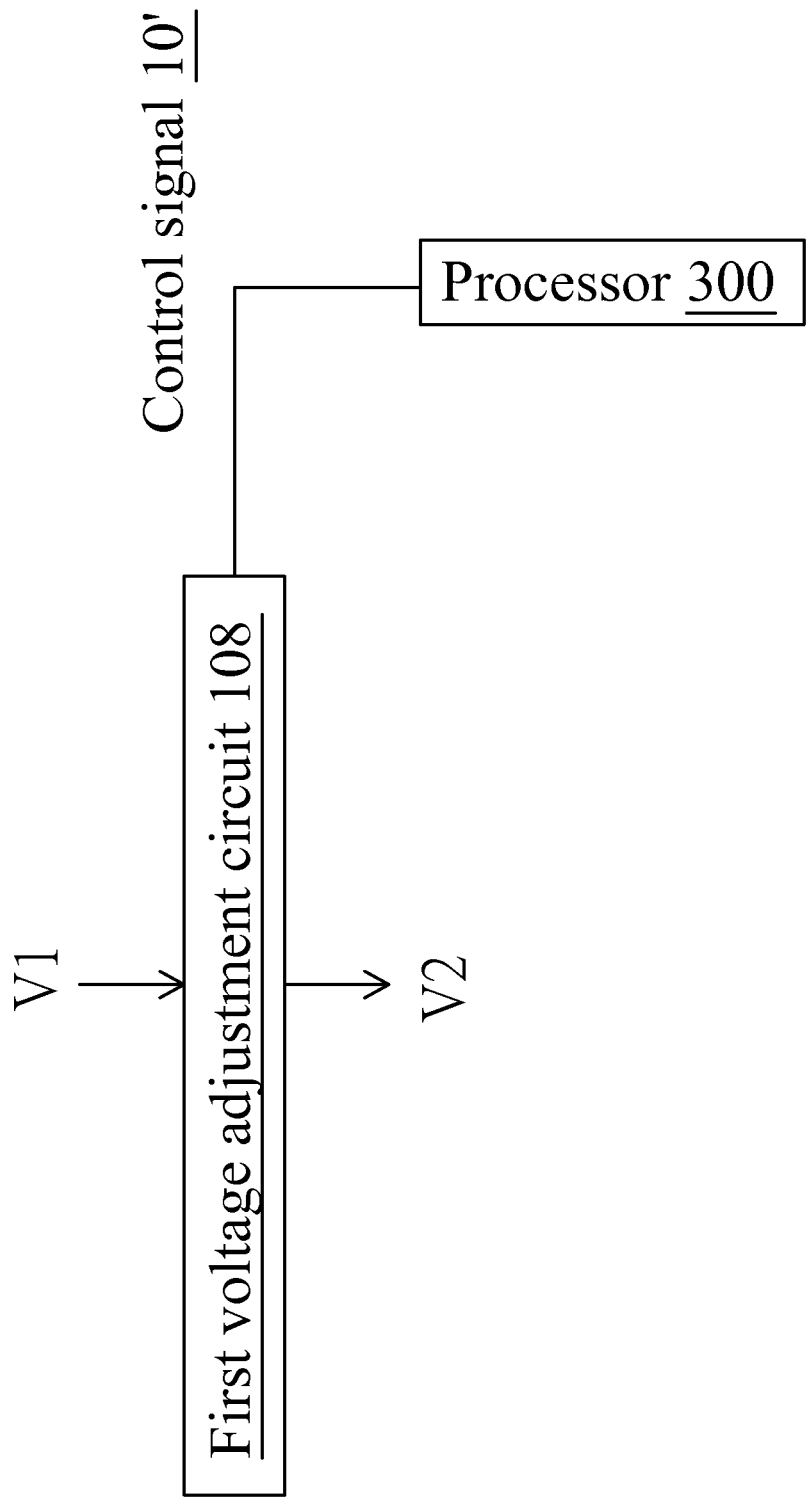
Figure 2H:
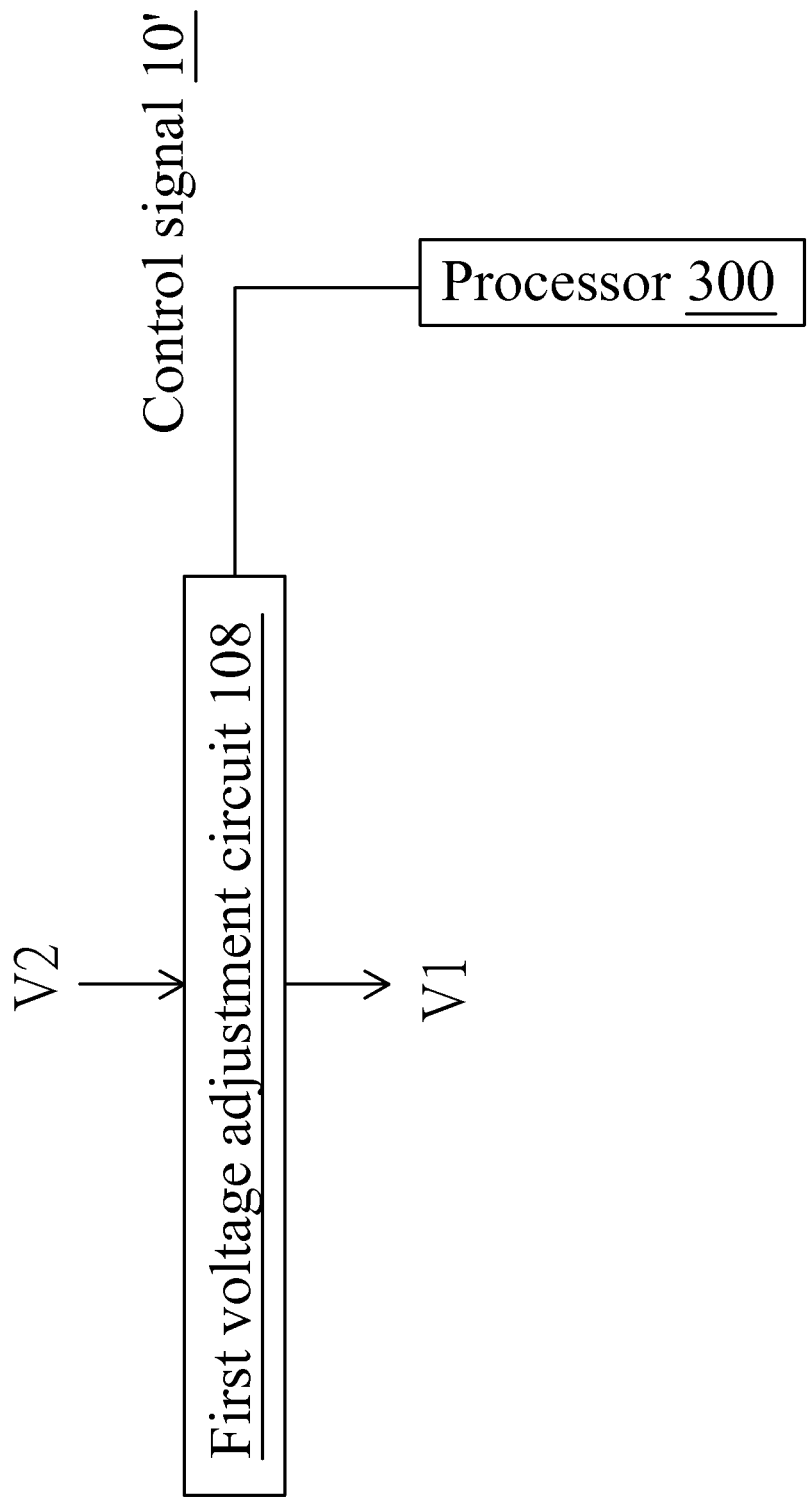

In other preferred embodiments of the present invention as shown in FIGS. 2F to 2H, the first power control circuit 100 may further include a first voltage adjustment circuit 108 coupled to the processor 300, one of the first voltage V1 and the second voltage V2 may be inputted to the first voltage adjustment circuit 108 to adjust a difference between the first voltage V1 and the second voltage V2 according to a control signal 10' from the processor 300.

Preferably, one of the first voltage V1 and the second voltage V2 may further be inputted to the first voltage adjustment circuit 108 to be adjusted to one another according to the control signal from the processor 300. That is, the first voltage V1 may be adjusted to the second voltage V2, or the second voltage V2 may be adjusted to the first voltage V2 according to the control signal 10' from the processor 300, such that the adjusted first voltage V1 may be inputted to one of the M first traces and the adjusted second voltage V2 may be inputted to the rest of the M first traces. Note that the voltage adjustment element 102 and the first voltage adjustment circuit 108 may be utilized together, or one of those may be utilized separately.

Figure 3:
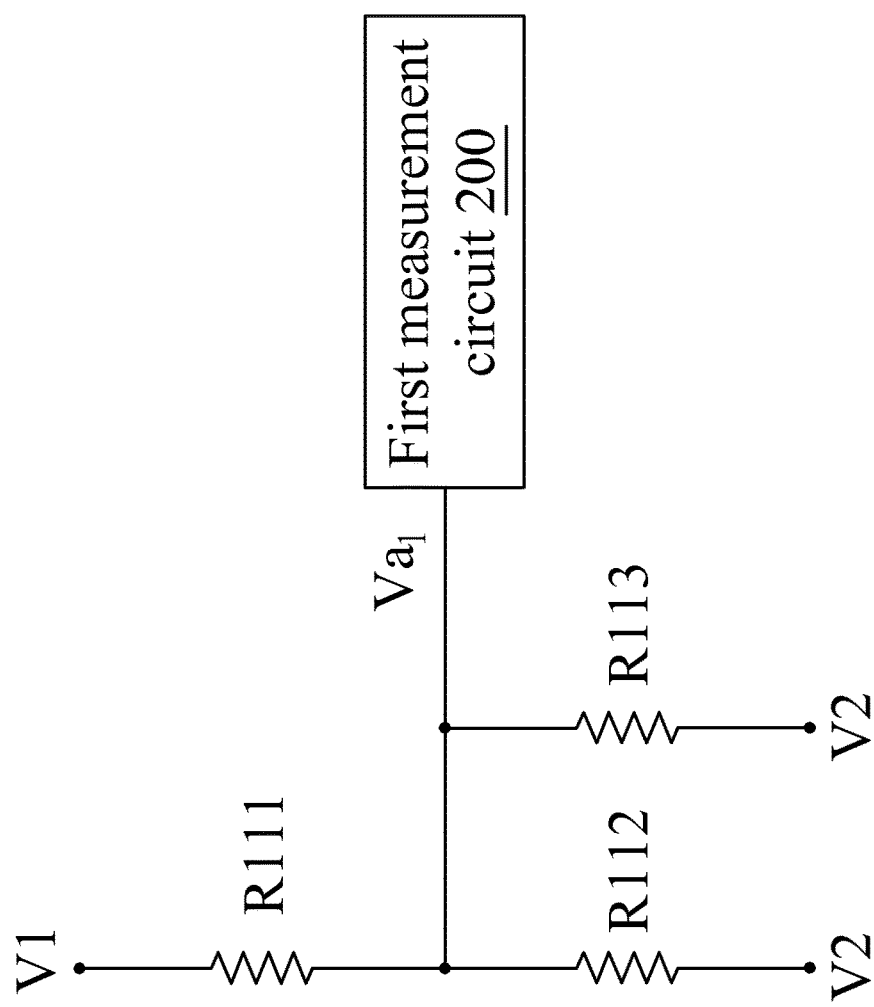
FIG. 3 is an equivalent circuit diagram of resistors of a first row of the resistor matrix in FIG. 1.

Please refer to FIG. 3, which is an equivalent circuit diagram of resistors of a first row of the resistor matrix in FIG. 1. In FIG. 3, the equivalent circuit is effectively the circuit in which the first power control circuit 100 applies the first voltage V1 to the first trace 111 and the second voltage V2 to the other first traces 112 and 113, and the first measurement circuit 200 measures the first voltage level Va1 on the second trace 121. Here, Va1 means the first voltage level Va measured in this particular frame, and can be expressed by the following equation:

$$Va1 = \frac{R_{112}R_{113}}{R_{111}R_{112} + R_{111}R_{113} + R_{112}R_{113}}(V1 - V2) + V2 \quad (1)$$

where $R_{111}$, $R_{112}$, $R_{113}$ in equation (1) mean the resistances of the resistors R111, R112, R113.

Figure 4:
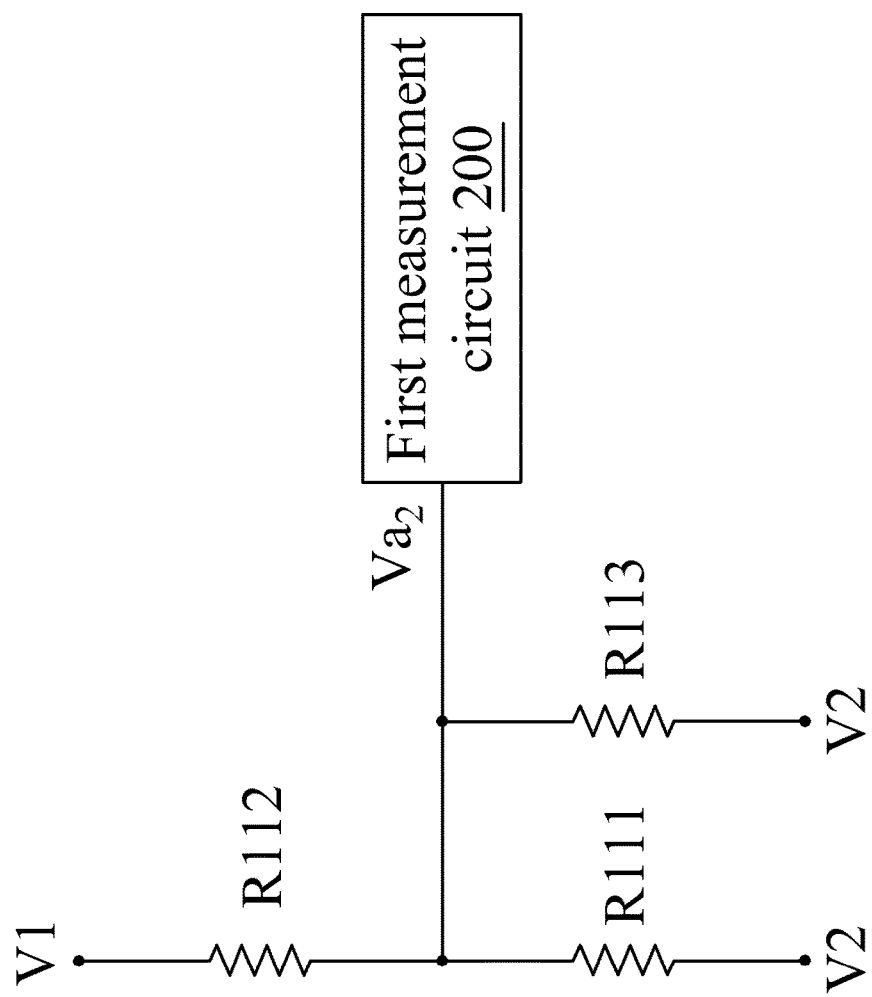
FIG. 4 is another equivalent circuit diagram of resistors of a first row of the resistor matrix in FIG. 1.

Subsequently, please refer to FIG. 4, which is another equivalent circuit diagram of resistors of a first row of the resistor matrix in FIG. 1. In FIG. 4, the equivalent circuit is effectively the circuit in which the first power control circuit 100 applies the first voltage V1 to the first trace 112 and the second voltage V2 to the other first traces 111 and 113, and the first measurement circuit 200 measures the first voltage level Va2 on the second trace 121. Here, Va2 means the first voltage level Va measured in this particular frame, and can be expressed by the following equation:

$$Va2 = \frac{R_{111}R_{113}}{R_{111}R_{112} + R_{111}R_{113} + R_{112}R_{113}}(V1 - V2) + V2 \quad (2)$$

Combining equations (1) and (2), the following relationship can be obtained:

$$R_{112} = \frac{Va1 - V2}{Va1 - V2}R_{111} \quad (3)$$

Since $R_{111}$ is the resistance of the reference resistor R111 and is known, and V2 is the second voltage given by the setting of the first power control circuit 100, the resistance $R_{112}$ of the variable resistor R112 can be calculated. Preferably, the V2 can be set as zero to simplify the calculation. Therefore, the processor 300 can determine if the input signal is input on the area relating to the variable resistor R112 by the variation of the resistance $R_{112}$ of the variable resistor R112. Moreover, the relationship between the resistance $R_{112}$ of the variable resistor R112 and the magnitude of the input signal is known according to the type of the variable resistor, so if the resistance $R_{112}$ of the variable resistor R112 is provided, the magnitude of the input signal can be calculated as well. For example, such relationship can be stored as a table in the processor 300, and after the scanning process is performed by the first power control circuit 100 and the first measurement circuit 200, the processor 300 determines the magnitude of the input signal by look-up table (LUT) method. Following the same way as described above, the resistance of the variable resistor R113 can be obtained by the first voltage level Va measured in another frame, and the resistances of the variable resistors R122, R123, R132, and R133 can be obtained by the first voltage levels Vb and Vc measured on the second traces 122 and 123 (the resistances of the reference resistors R211 and R311 are known). Finally, the input location and magnitude of the input signal can be known by the obtained resistances of the variable resistors R112, R113, R212, R213, R312, and R313 of the resistor matrix.

In some embodiments, the variable resistors may be force sensing resistors (FSR), and thus the input signal may be touching force. That is, when a user touches one or more area, resistances of ore or more variable resistors corresponding to the ore or more touched area change accordingly. Therefore, the input device of the embodiment of the present invention can determine where the user touches and how much force he applies. However, the present invention is not limited thereto. For example, the variable resistors may be photoresistors, the input signal may be light, and therefore some embodiments of the present invention can determine where the light is irradiated on and how bright the light is. The variable resistors may be thermistors, the input signal may be heat, and therefore some embodiments of the present invention can determine where a hot source approaches and how long the hot source stays by the variation of the measured temperature.

Figure 5:
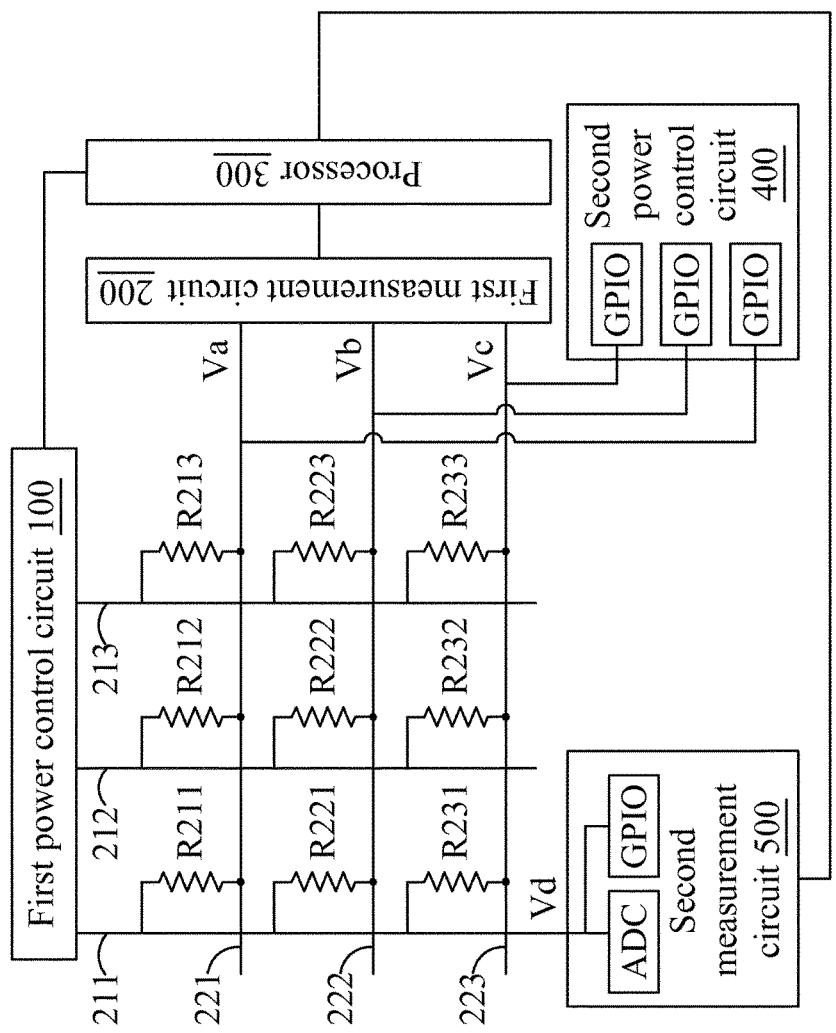
FIG. 5 is a schematic diagram of a resistive input system according to a second embodiment of the present invention.

Please refer to FIG. 5, which is a schematic diagram of a resistive input system according to a second embodiment of the present invention. In FIG. 5, the 3*3=9 resistors may include 9 variable resistors (i.e., the resister matrix is composed of variable resistors). The resistive input system may further include a second power control circuit 400 and a second measurement circuit 500. The second power control circuit 400 coupled to the 3 second traces 221, 222, and 223 and providing a third voltage V3 to one of the 3 second traces 221, 222, and 223 and a fourth voltage V4 to the rest of the 3 second traces 221, 222, and 223. The second measurement circuit 500 is coupled to the first trace 211 and the processor 300 and measures variations of a second voltage level of the one of the 3 first traces while the second power control circuit 400 provides the third voltage V3 to the one of the 3 second traces 221, 222, and 223 and the fourth voltage V4 to the rest of the N second traces 221, 222, and 223. The processor 300 determines ratios of resistance of one variable resistor to that of another variable resistor according to the variations of the first voltage level and the second voltage level, and determines a relative magnitude distribution according to the ratios.

Sometimes, the specific magnitude of the input signal is not needed, and what of interest is a relative magnitude distribution of the input signal. Therefore, the reference resistors in the first embodiment are not required. Since the reference resistor cannot be used to sense the input signal, the design of the input device of this embodiment can also reduce the number of the elements without sensing function and thus reduce the cost. In following paragraphs, how the input device of this embodiment works will be explained in detail.

Figure 6:
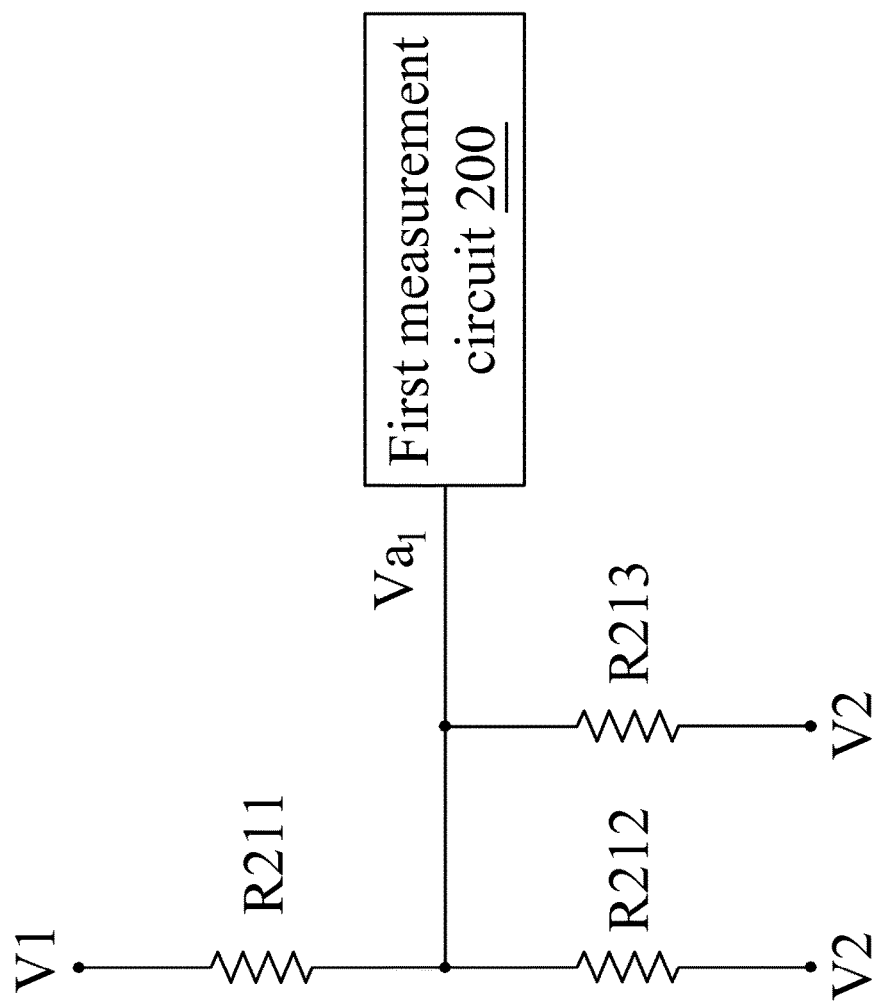
FIG. 6 is an equivalent circuit diagram of resistors of a first row of the resistor matrix in FIG. 5.
Figure 7:
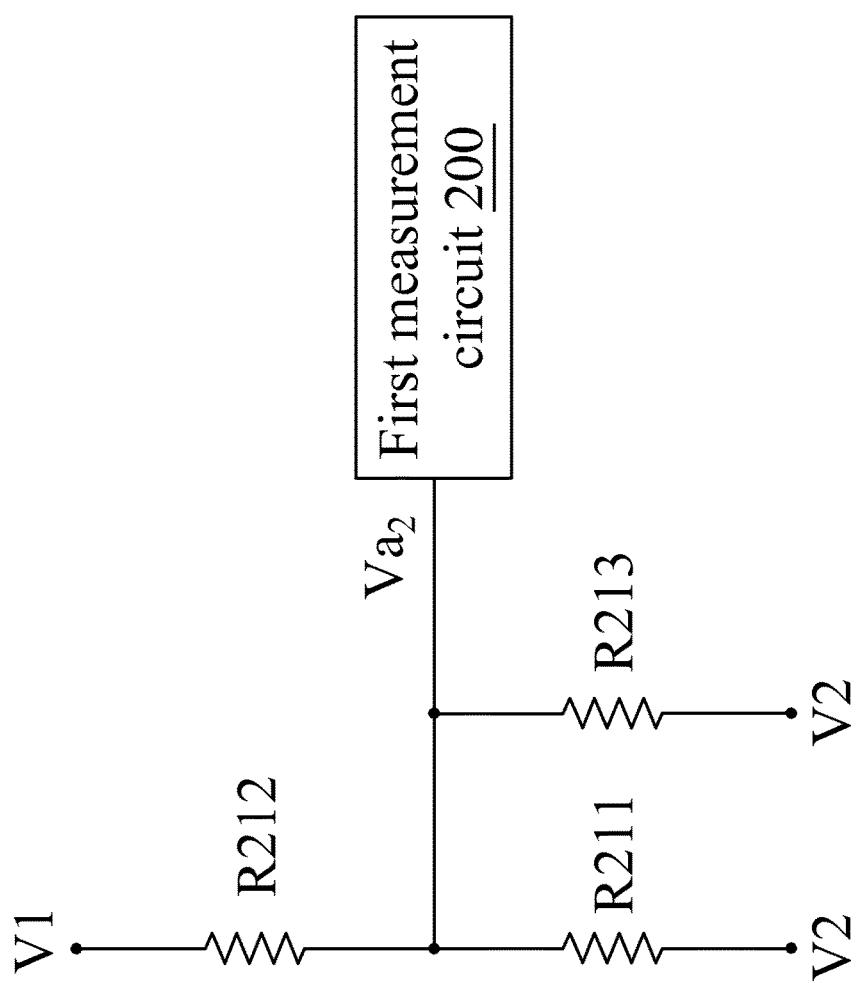
FIG. 7 is an equivalent circuit diagram of resistors of a first row of the resistor matrix in FIG. 5.

Please refer to FIGS. 5 and 6, which are equivalent circuit diagrams of resistors of a first row of the resistor matrix in FIG. 5. As described in the first embodiment, the ratio of the resistance $R_{211}$ of the variable resistor R211 to the resistance $R_{212}$ of the variable resistor R212 can be obtained by the equivalent circuits shown in FIGS. 5 and 6, except for that the resistance $R_{211}$ of the variable resistor R211 is unknown here. By the same method, the three ratios $R_{211}:R_{212}:R_{213}$, $R_{221}:R_{222}:R_{223}$, and $R_{231}:R_{232}:R_{233}$ can be obtained by the variations of the first voltage levels Va, Vb, and Vc, respectively.

After the scanning process described in the last paragraph is done, the resistance ratios for the variable resistors on the same row are known, but the resistance ratios for the variable resistors on different rows are still unknown. Therefore, in this embodiment, the input device further includes the second power control circuit 400 and the second measurement circuit 500. In particular, the second power control circuit 400 may apply the third voltage V3 to the second traces 221, 222, and 223 in a predetermined sequence, where the predetermined sequence may be 221->222->223, and the second power control circuit 500 may also apply the fourth voltage V4 to other second traces on which the third voltage V3 is not applied. In this period, the second measurement circuit 500 is coupled to the first traces 211 and measures the second voltage levels Vd on the second traces 211.

Figure 8:
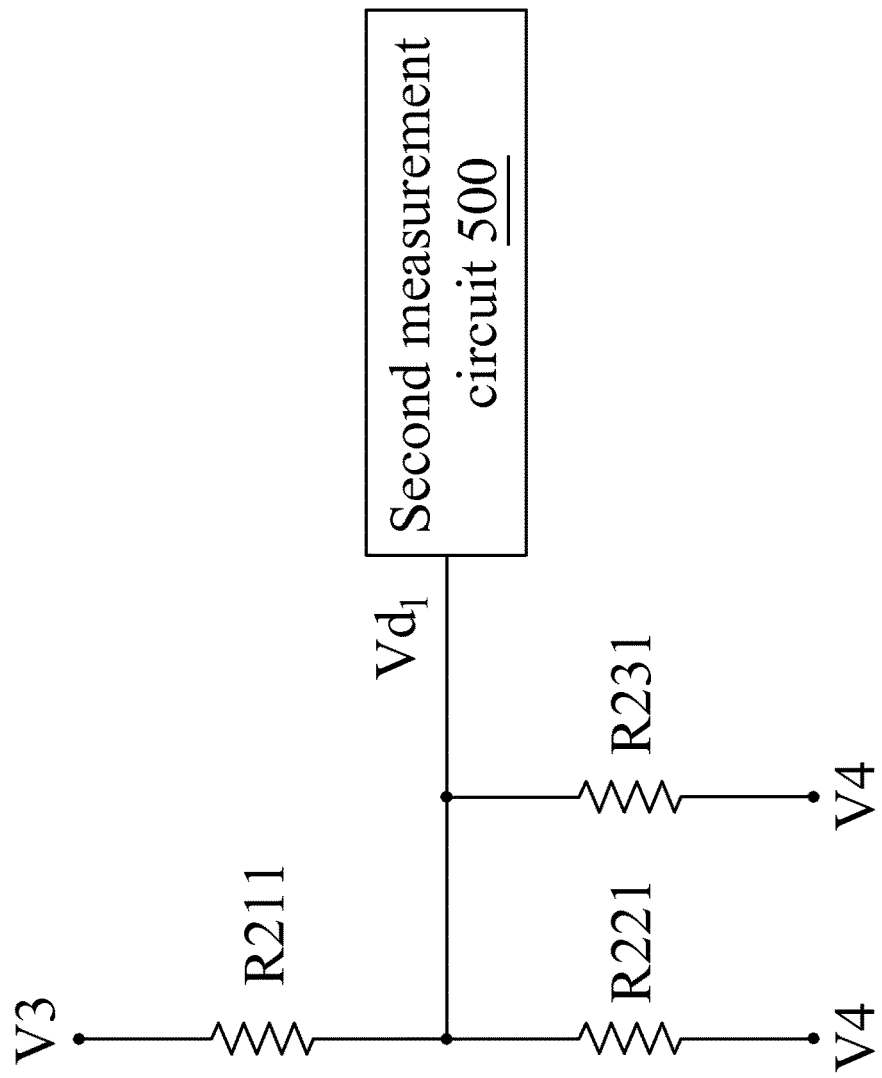
FIG. 8 is an equivalent circuit diagram of resistors of a first column of the resistor matrix in FIG. 5.

Please refer to FIG. 8, which is an equivalent circuit diagram of resistors of a first column of the resistor matrix in FIG. 5. In FIG. 8, the equivalent circuit is effectively the circuit in which the second power control circuit 400 applies the third voltage V3 to the second trace 211 and the fourth voltage V4 to the other second traces 221 and 231, and the second measurement circuit 500 measures the second voltage level Vd1 on the first trace 221. Here, Vd1 means the second voltage level Vd measured in this particular frame, and can be expressed by the following equation:

$$Vd1 = \frac{R_{221}R_{231}}{R_{211}R_{221} + R_{211}R_{231} + R_{221}R_{231}}(V3 - V4) + V4 \quad (4)$$

Figure 9:
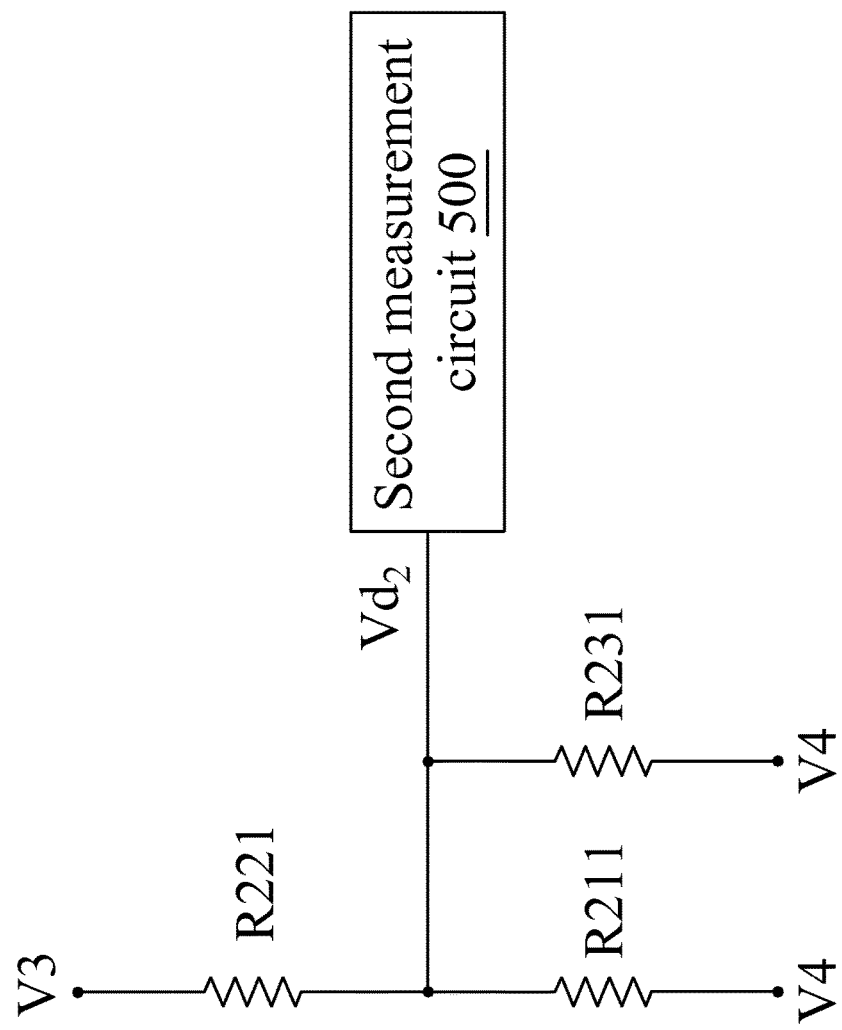
FIG. 9 is an equivalent circuit diagram of resistors of a first column of the resistor matrix in FIG. 5.

Subsequently, please refer to FIG. 9, which is another equivalent circuit diagram of resistors of a first column of the resistor matrix in FIG. 5. In FIG. 9, the equivalent circuit is effectively the circuit in which the second power control circuit 400 applies the third voltage V3 to the second trace 221 and the fourth voltage V4 to the other second traces 211 and 231, and the second measurement circuit 500 measures the second voltage level Vd2 on the first trace 221. Here, Vd2 means the second voltage level Vd measured in this particular frame, and can be expressed by the following equation:

$$Vd1 = \frac{R_{221}R_{231}}{R_{211}R_{221} + R_{211}R_{231} + R_{221}R_{231}}(V3 - V4) + V4 \quad (5)$$

Combining equations (4) and (5), the following relationship can be obtained:

$$R_{221} = \frac{Vd1 - V4}{Vd2 - V4} R_{211} \quad (6)$$

From the equation (6), the resistance ratio of the variable resistor R221 to the variable resistor R211 can be derived. Following the same way, the resistance ratio of the variable resistor R231 to the variable resistor R211 can be derived. That is, the ratio $R_{211}:R_{221}:R_{231}$ can be obtained by the scanning process of the second power control circuit 400 and the second measurement circuit 500. Since the ratios $R_{211}:R_{212}$ $R_{213}$, $R_{221}:R_{222}:R_{223}$, and $R_{231}:R_{232}:R_{233}$ are already known, the resistance ratio of any variable resistor to another variable resistor can be calculated. If the magnitude of the input is positively or negatively correlated to the resistance of the variable resistor, the relatively magnitude distribution of the input signal can thereby calculated.

Figure 10:
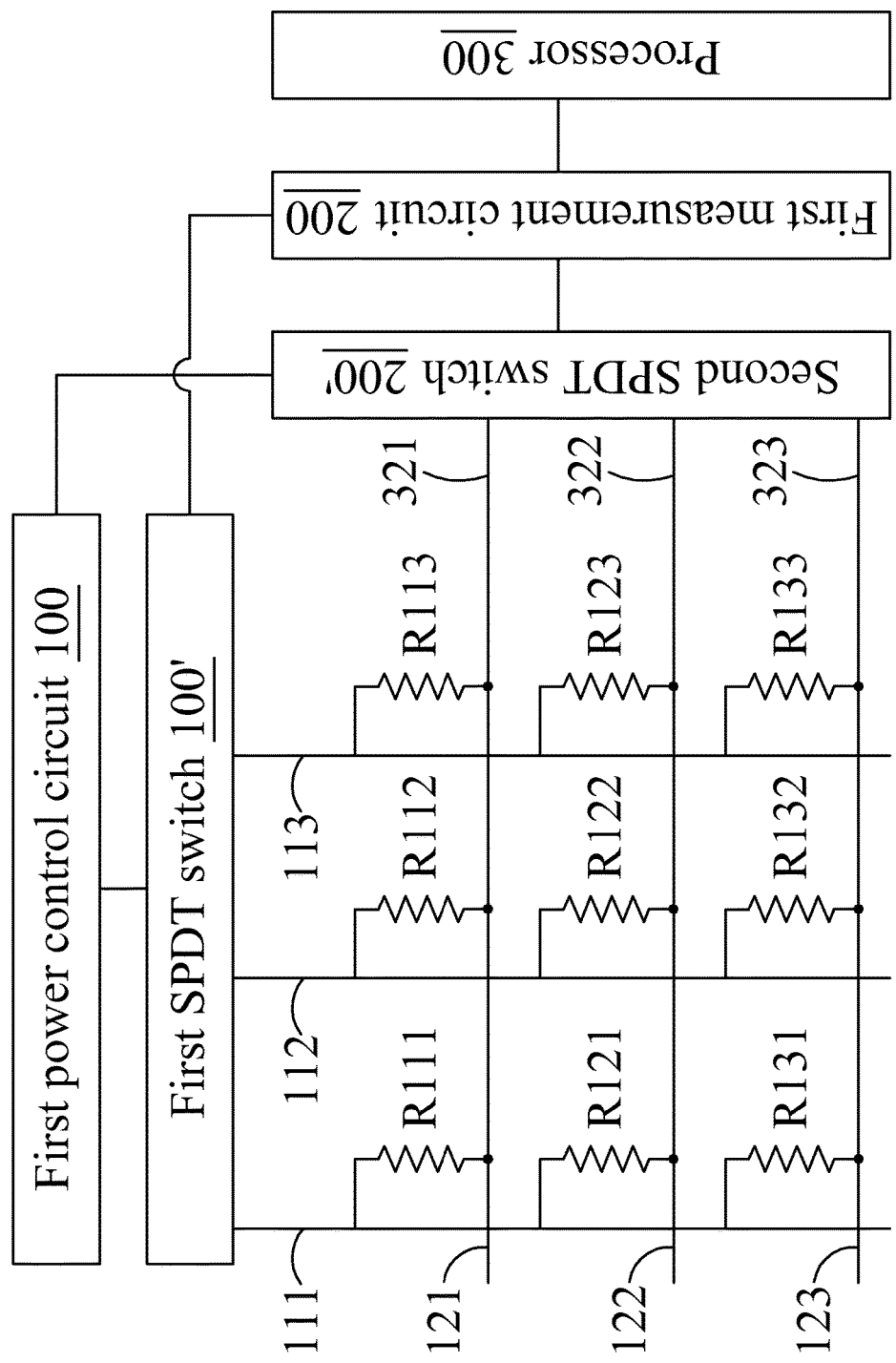
FIG. 10 is a schematic diagram of a resistive input system according to another embodiment of the present invention.

Please refer to FIG. 10, which is a schematic diagram of a resistive input system according to another embodiment of the present invention. In this embodiment of the present invention, the functions of the first power control circuit 100 and the second measurement circuit 500 of the second embodiment can be realized by one circuit, for example, a first "single-pole, double-throw" circuit (SPDT) 100' shown in FIG. 10. The first SPDT 100' has terminals respectively coupled to the first traces, and has two additional terminals. One of the additional terminals can be coupled to a sub-circuit with input function, and another one can be coupled to a sub-circuit with output function. Therefore, the first SPDT 100' can use a switch to change the connection condition between the terminals coupled to the first traces and the additional terminals so as to switch functions of applying voltages to the first traces and receiving voltage levels from the first traces. Similarly, the functions of the second power control circuit 400 and the second measurement circuit 500 of the second embodiment can be realized by one circuit, such as the second SPDT 200' shown in FIG. 10, as well. However, the prevent invention is not limited thereto, the functions of the first power control circuit 100, the first measurement circuit 200, the second power control circuit 400, and the second measurement circuit 500 can be still realized by discrete or separate circuits.

Preferably, the variable resistors are made of the same material. When the environmental factors, such as temperature and humidity, change, the electronic property of the variable resistor changes as well. Fortunately, the variable resistors made of the same material usually have the same response to the change of environmental factors. For example, if resistance $R_1$ of a FSR R1 can be expressed as:

$$R_1 = k(T,H) * R_{10}(M_1) \quad (7)$$

where k(T,H) means the coefficient k affected by temperature T and humidity H, $R_{10}(M_1)$ means the resistance of the FSR R1 measured at room temperature and humidity 0% under a certain force $M_1$. Therefore, resistance $R_2$ of another FSR R2 disposed in the same input device as the FSR R1 can be expressed as:

$$R_2 = k(T,H) * R_{20}(M_2) \quad (8)$$

where $R_{20}$ ($M_2$) means the resistance of the FSR R2 measured at room temperature and humidity 0% under a certain force $M_2$. Since the FSRs R1 and R2 are made of the same material, they both have the same coefficient k for the environmental factors. Combining the equation (7) and (8), the following relation can be obtained:

$$\frac{R_1}{R_2} = \frac{k(T,H) * R_{10}(M_1)}{k(T,H) * R_{20}(M_2)} = \frac{R_{10}(M_1)}{R_{20}(M_2)} \quad (9)$$

The equation (9) shows the resistance ratio of the FSR R1 to the FSR R2 keeps the same regardless of the change of environmental factors. Hence, if the variable resistors of the resistor matrix are made of the same material, or preferably are the same variable resistor, the measured relative magnitude distribution can be free from the effect of the environmental factors.

Similar to the first embodiment, in this embodiment, the variable resistors may be force sensing resistors (FSR), and thus the input signal may be touching force. However, the present invention is not limited thereto.

Figure 11:
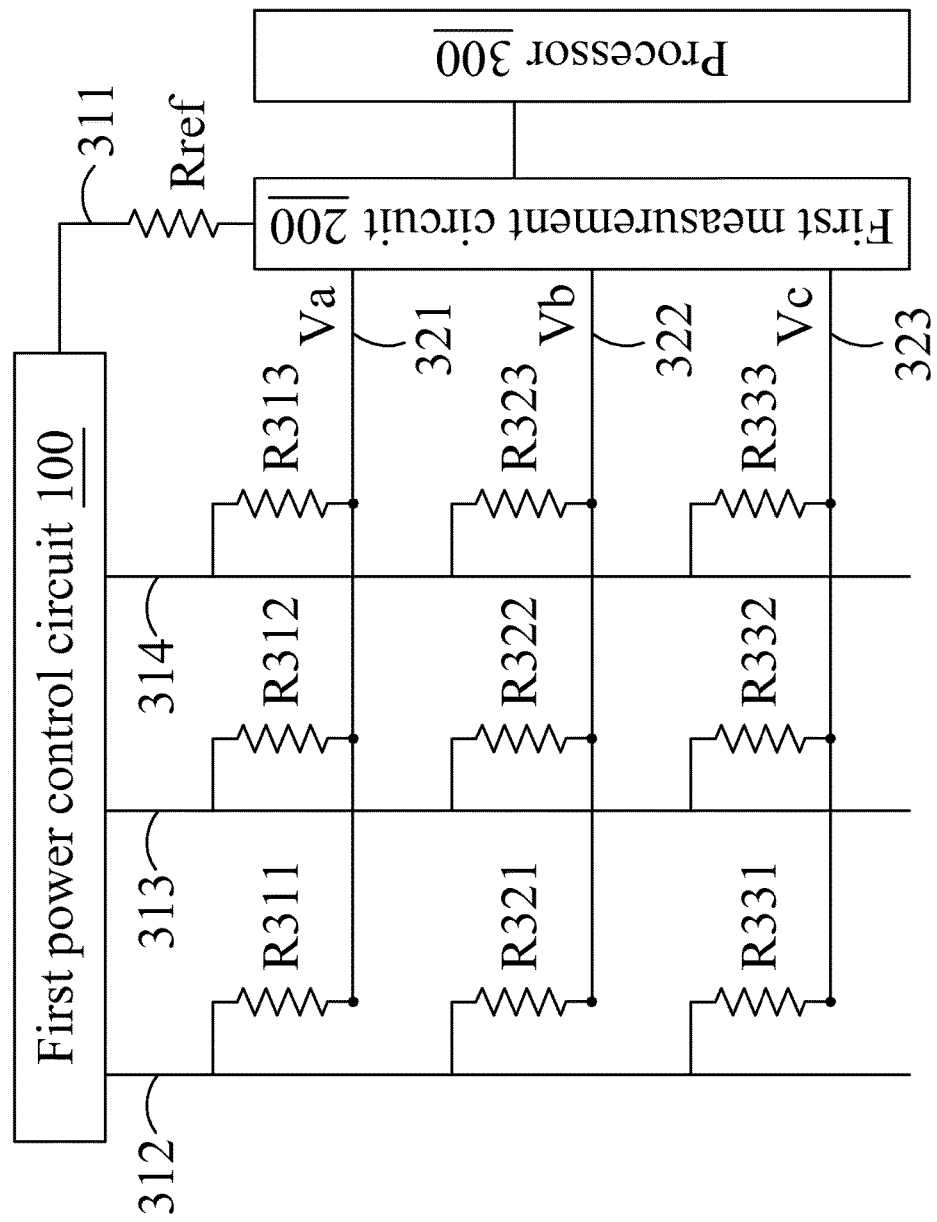
FIG. 11 is a schematic diagram of a resistive input system according to a third embodiment of the present invention.

Please refer to FIG. 11, which is a schematic diagram of a resistive input system according to a third embodiment of the present invention. In FIG. 11, the 3*3=9 resistors may include 3*3=9 variable resistors (i.e., the resister matrix is composed of variable resistors). The resistive input system may further include a reference resistor Rref, where a first end 311 of the reference resistor Rref coupled to the first power control circuit 100, and a second end of the reference resistor Ref coupled to first measurement circuit. The reference resistor is electrically coupled to one of the 3 second traces 321, 322, and 323 measured by the first measurement circuit 200 and isolated from the rest of the second traces. The first power control circuit 100 provides the first voltage V1 to one of the first end 311 of the reference resistor Rref and the 3 first traces 312, 313, and 314 and a second voltage V2 to the rest of the first end 311 of the reference resistor Rref and the 3 first traces 312, 313, and 314. The first measurement circuit 200 measures variations of the first voltage level of each of the second traces 321, 322, and 323 while the first power control circuit 100 provides the first voltage V1 to one of the first end 311 of the reference resistor Rref and the 3 first traces 312, 313, and 314 and the second voltage V2 to the rest of the first end 311 of the reference resistor Rref and the 3 first traces 312, 313, and 314. The processor 300 determines ratios of resistance of the reference resistor Rref to that of each of the variable resistors R311 to R333 according to the variations of the first voltage level, and determines a magnitude of the input signal according to the ratios.

Figure 12:
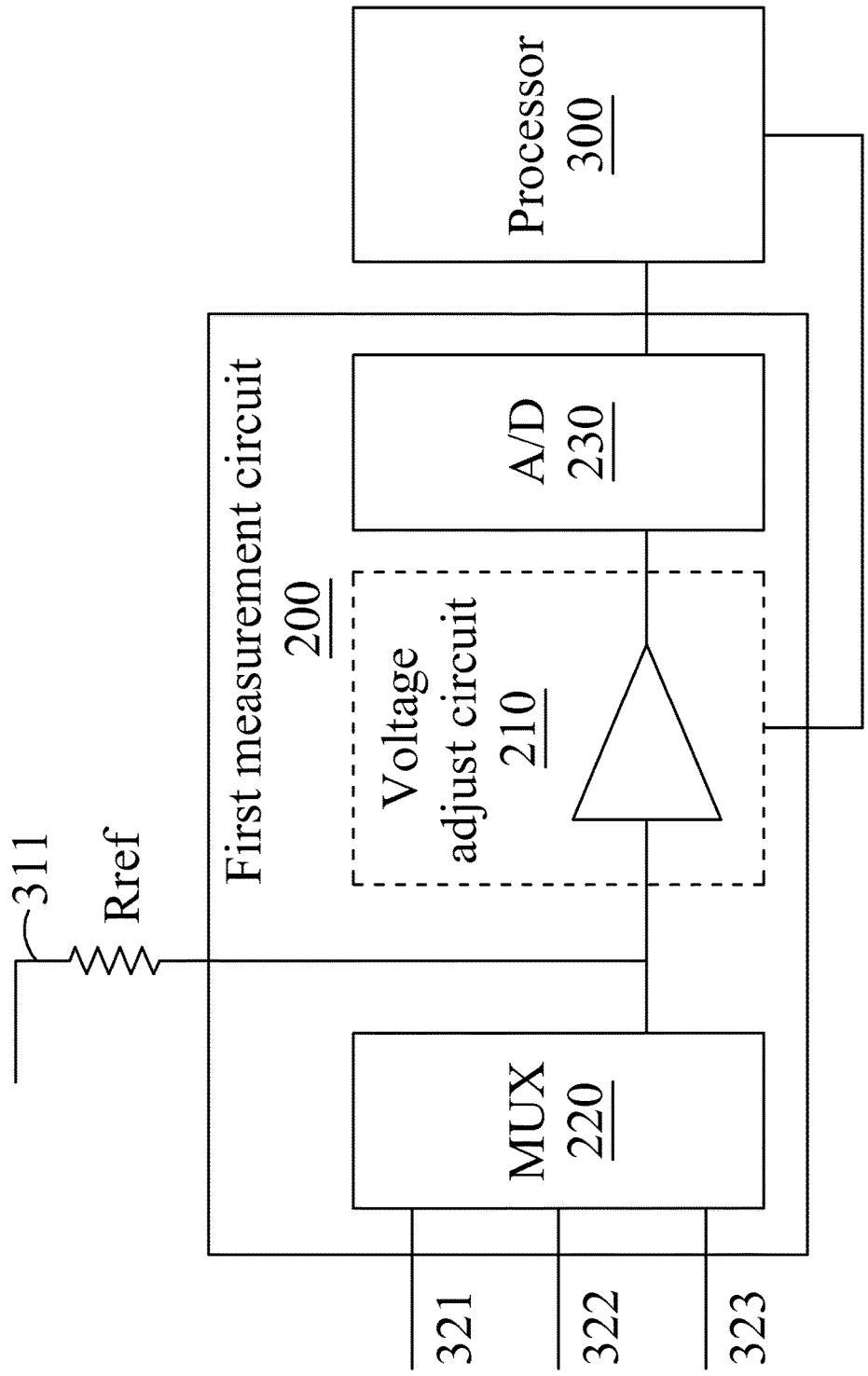
FIG. 12 is a schematic diagram of a measurement circuit of a resistive input system according to a third embodiment of the present invention.

Please refer to FIG. 12, which is a schematic diagram of a measurement circuit of a resistive input system according to a third embodiment of the present invention. In FIG. 12, the first measurement circuit 200 may include an analog-to-digital convertor (ADC) 230 and a multiplexer (MUX) 220. According to the scanning process of the first measurement circuit 200, the MUX 220 couples one of the second traces 211, 212, 213 to the reference resistor Rref and the ADC 230. The ADC 230 converts the received first voltage level to a digital signal for the processor 300. Since in one scanning procedure, the MUX 220 only makes one scanned second trace couple to the reference resistor Rref and the ADC 230, the rest of second traces not scanned are isolated from the reference resistor Rref and ADC 230.

In particular, this embodiment is similar to the first embodiment, except for that the function of the reference resistors of the left column are replaced by one reference resistor Rref coupled to the 3 second traces 321, 322, and 323. In other words, the number of the elements that the first power control circuit 100 has to scan is the number of the first traces plus one (in this embodiment, the number of the elements scanned by the first power control circuit 100 is 3+1=4). One apparent advantage of this design is that the number of the electronic elements without sensing function can be reduced and thus the cost can be reduced as well. In this embodiment, the first power control circuit 100 may apply the first voltage V1 to the first end 311 of the reference resistor Rref together with the first traces 312, 313, and 314 in a predetermined sequence, where the predetermined sequence may be 311->312->313->314, and the first power control circuit 100 may also apply the second voltage V2 to the first end 311 of the reference resistor Rref together or the first traces 312, 313, and 314 on which the first voltage V1 is not applied. In this period, the first measurement circuit 200 is coupled to the second traces 321, 322, and 323, and measures the first voltage levels Va, Vb, and Vc on the second traces 321, 322, and 323, respectively.

Figure 13:
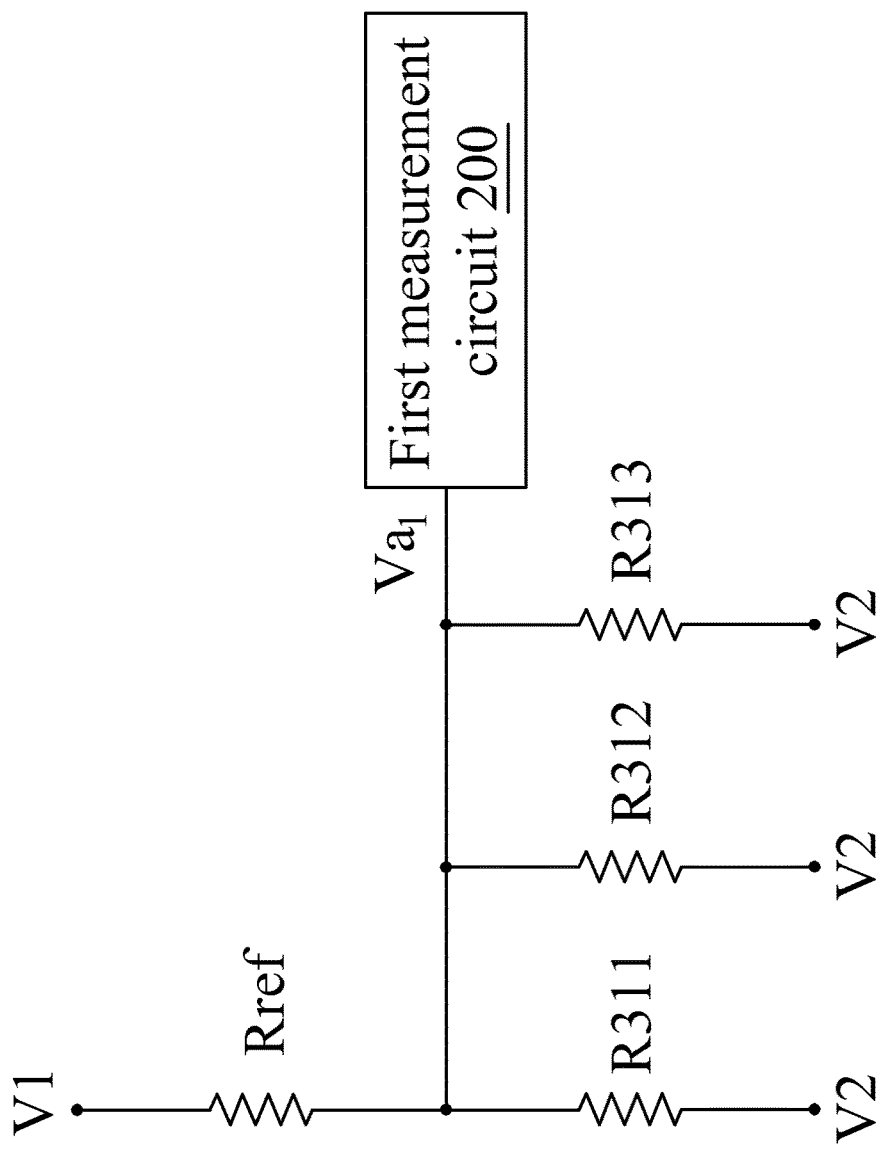
FIG. 13 is an equivalent circuit diagram of resistors of a first row of the resistor matrix in FIG. 11.

Please refer to FIG. 13, which is an equivalent circuit diagram of resistors of a first row of the resistor matrix in FIG. 11. To more clearly show how the input device of this embodiment will work, the operation of one row of the resistor matrix will be described in details in the following. In FIG. 13, the equivalent circuit is effectively the circuit in which the first power control circuit 100 apply the first voltage V1 to the first end 311 of the reference resistor Rref and the second voltage V2 to the first traces 312, 313, and 314, and the first measurement circuit 200 measures the first voltage level Va1 on the second trace 321. Here, Va1 means the first voltage level Va measured in this particular frame, and can be expressed by the following equation:

$$Va1 = \frac{R_{311}R_{312}R_{313}}{R_{ref}R_{311}R_{312} + R_{ref}R_{311}R_{313} + R_{ref}R_{312}R_{313} + R_{311}R_{312}R_{313}}(V1 - V2) + V2 \quad (10)$$

Figure 14:
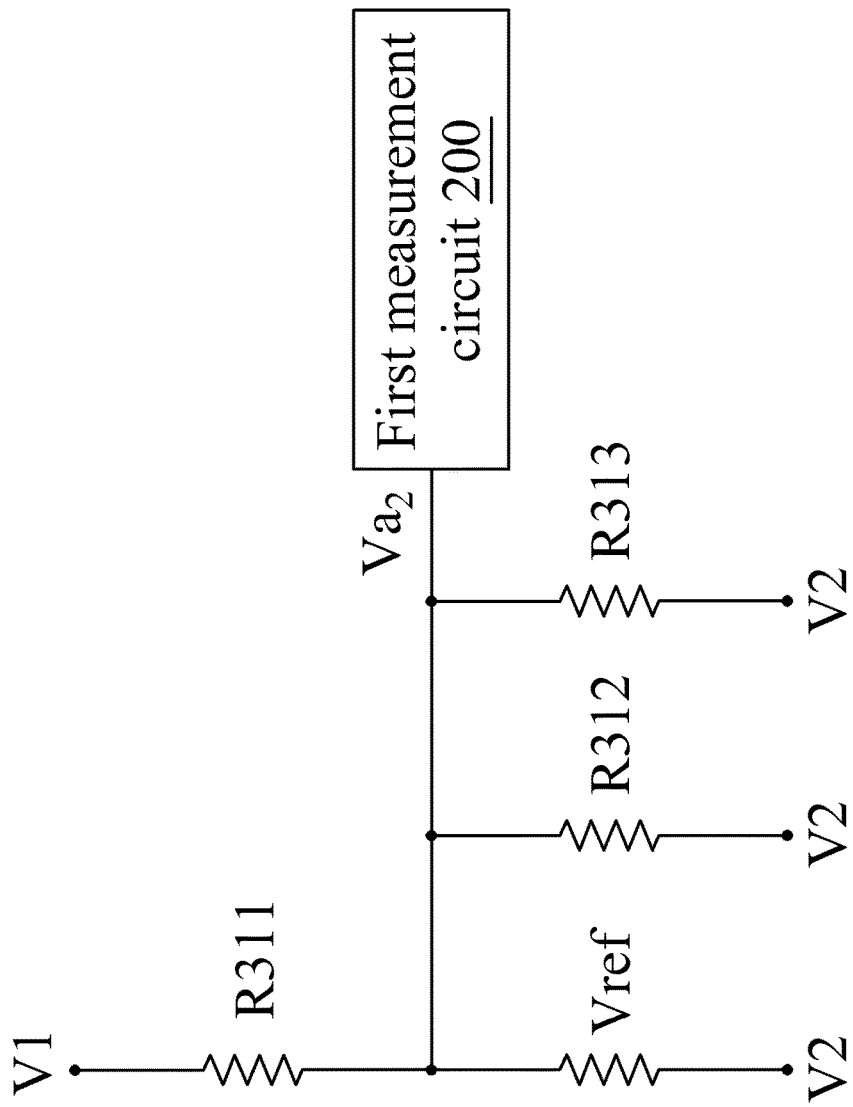
FIG. 14 is an equivalent circuit diagram of resistors of a first row of the resistor matrix in FIG. 11.

Subsequently, please refer to FIG. 14, which is another equivalent circuit diagram of resistors of a first row of the resistor matrix in FIG. 11. In FIG. 14, the equivalent circuit is effectively the circuit in which the first power control circuit 100 applies the first voltage V1 to the first trace 311 and the second voltage V2 to the first end 311 of the reference resistor Rref and the other first traces 312 and 313, and the first measurement circuit 200 measures the first voltage level Va2 on the second trace 321. Here, Va2 means the first voltage level Va measured in this particular frame, and can be expressed by the following equation:

$$Va2 = \frac{R_{ref}R_{312}R_{313}}{R_{ref}R_{311}R_{312} + R_{ref}R_{311}R_{313} + R_{ref}R_{312}R_{313} + R_{311}R_{312}R_{313}}(V1 - V2) + V2 \quad (11)$$

Combining equations (10) and (11), the following relationship can be obtained:

$$R_{311} = \frac{Va1 - V4}{Va2 - V4} R_{ref} \quad (12)$$

Similarly to the first embodiment, since $R_{ref}$ is the resistance of the reference resistor Rref and is known, and V2 is the second voltage given by the setting of the first power control circuit 100, the resistance $R_{311}$ of the variable resistor R311 can be calculated. Preferably, the V2 can be set as zero to simplify the calculation. By the same method, the resistance of other variable resistors can also be calculated. Since the calculations are all similar, the details are omitted here. Finally, the resistances of all variable resistors in the resistor matrix in the input device can be calculated by the reference resistor Rref, and thus the input location and magnitude of the input signal can be determined.

Preferably, the reference resistor Rref and the variable resistors R311 to R333 may be made of the same material and a predetermined input signal is applied on the reference resistor.

As mentioned above, when two variable resistors are made of the same material, or more preferably, the two variable resistors are substantially the same, the effect of the environmental factors can be prevented or reduced by the circuit design and the calculation utilized in the input devices of the embodiments of the present invention. Therefore, the reference resistor Rref can also be a variable resistor as the others, except for that the resistance $R_{ref}$ of the reference resistor Rref is known. Since the relationship between resistance of a variable resistor and magnitude of the input signal should be fixed, if there is a predetermined signal applied on the reference resistor Rref, the resistance $R_{ref}$ of the reference resistor Rref should be known as well. Hence, the input device can apply a predetermined input signal to the reference resistor Rref where the magnitude of the predetermined input signal can be set by the user. For example, if the reference resistor Rref and other variable resistors are all FSRs, the predetermined input signal can be a force applied on the reference resistor, which can be generated by the mechanical member, such as adjustable screws or strings. The user can adjust such mechanical member to control the force applied on the reference resistor Rref manually or via the processor 300.

Figure 15:
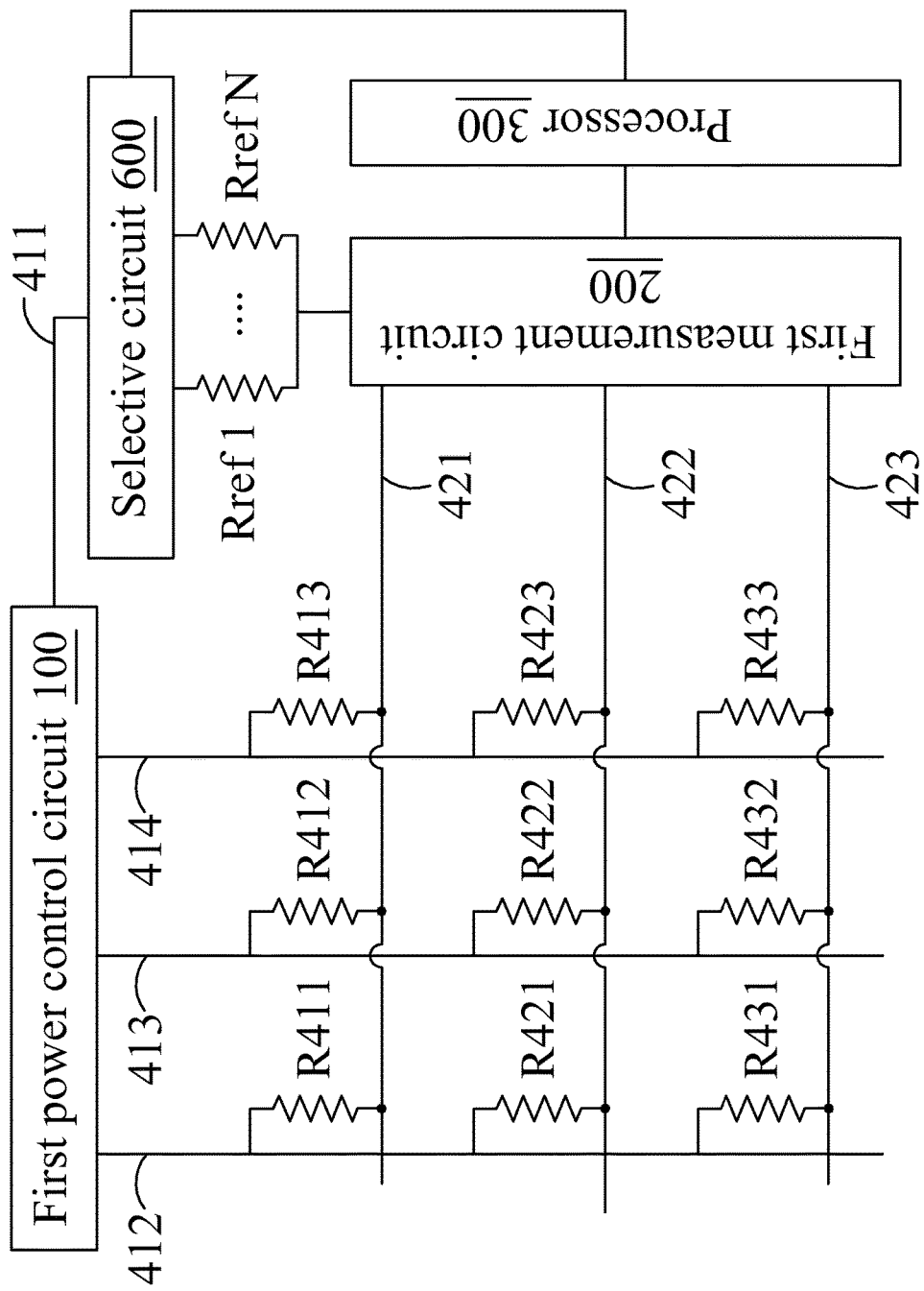
FIG. 15 is a schematic diagram of a resistive input system according to a fourth embodiment of the present invention.

Please refer to FIG. 15, which is a schematic diagram of a resistive input system according to a fourth embodiment of the present invention. In FIG. 15, the resistive input system may further include a selective circuit 600 and a plurality of reference resistors Rref1 to RrefN. The selective circuit 600 is coupled to the first power control circuit 100. The plurality of reference resistors Rref1 to RrefN have different resistances, and each of the reference resistors Rref1 to RrefN is coupled to the selective circuit 600 and the first measurement circuit 200. The selective circuit 600 selects one of the reference resistors Rref1 to RrefN and the selected reference resistor is couples the first power control circuit 100 to the first measurement circuit 200. The first measurement circuit 200 of this embodiment may be the same or similar to the design shown in FIG. 12, and thus the selected reference resistor can be coupled to one second trace scanned by the first measurement circuit 200 and isolated from the rest of second traces. The first power control circuit 100 provides the first voltage V1 to one of the selective circuit 600 (via one end 411 of the selective circuit 600) and the 3 first traces 412, 413, and 414 and a second voltage V2 to the rest of the selective circuit 600 and the 3 first traces 412, 413, and 414. The first measurement circuit 200 measures variations of the first voltage level of each of the second traces 421, 422, and 423 while the first power control circuit 100 provides the first voltage V1 to one of the selective circuit 600 and the 3 first traces 412, 413, and 414 and a second voltage V2 to the rest of the selective circuit 600 and the 3 first traces 412, 413, and 414. The processor 300 determines ratios of resistance of the one of the reference resistors Rref1 to RrefN to that of each of the variable resistors R411 to R433 according to the variations of the first voltage level, and determines a magnitude of the input signal according to the ratios.

This embodiment is similar to the third embodiment, except for that one reference resistor Rref is replaced by a plurality of reference resistors Rref1 to RrefN as well as a selective circuit 600. The selective circuit 600 may be a MUX or a like circuit. The selective circuit 600 selects one of the reference resistors Rref1 to RrefN, which have different resistances, to couple the first power control circuit 100 and the first measurement circuit 200. In other words, the reference resistor selected by the selective circuit 600 play the same role as the reference resistor Rref in the third embodiment. The difference is, the selective circuit 600 in this embodiment can select one reference resistor with appropriate resistance according to the variation range of the input signal. In particular, please refer to the equation (12) again, which shows that the calculated resistance of the variable resistor is generally in proportion to the resistance of the reference resistor. That is, the resistance of the variable resistor may be adjusted appropriately to correspond the resistance of the each of the variable resistors, such as R411 to R433 according to the variations of the first voltage level, such that the first voltage level from the scanned second trace may be further adjusted to a working range for the ADC 230, therefore the resolution of the first voltage level converted by the ADC 230 may be improved.

Figure 16A:
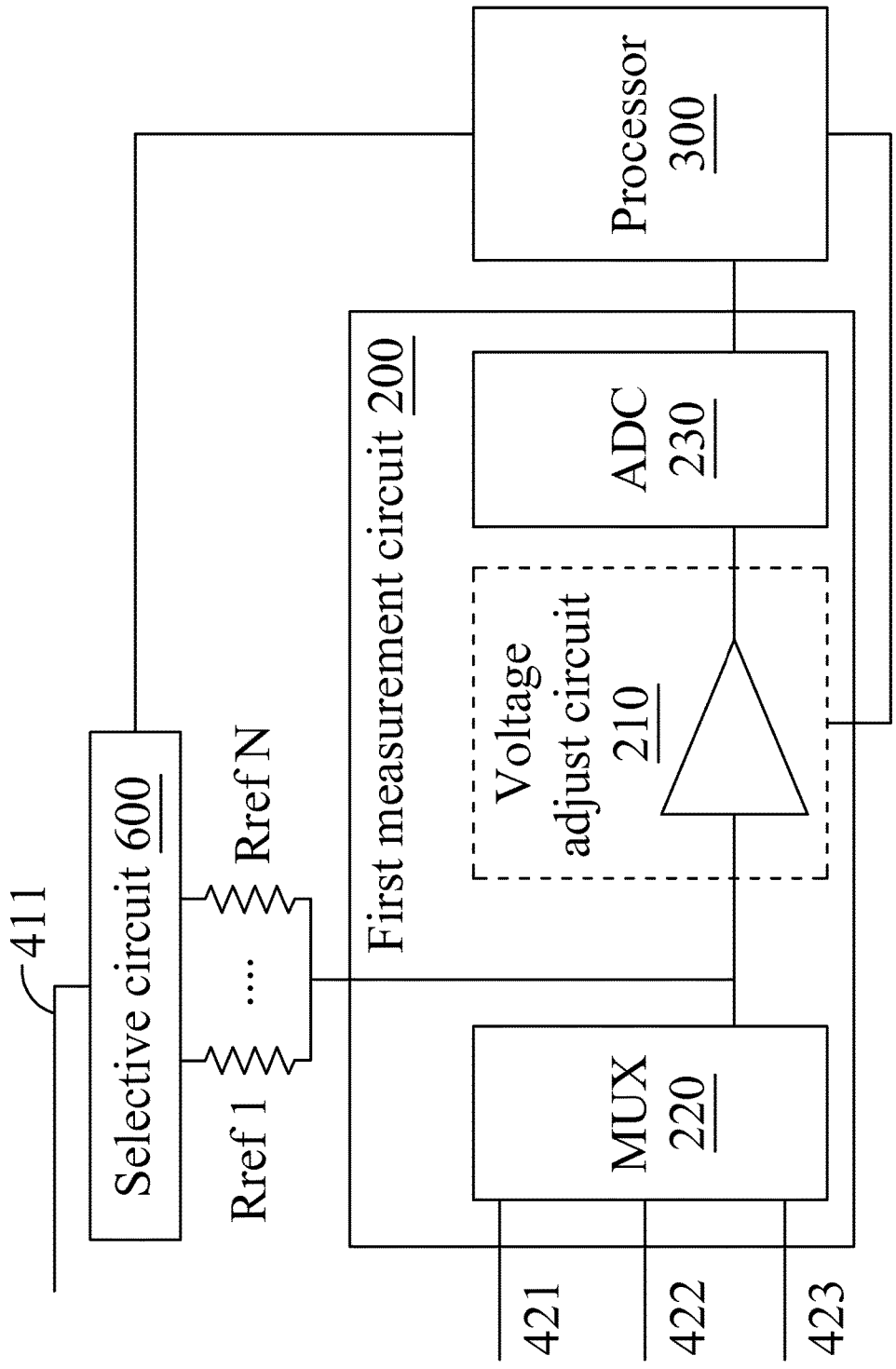
FIGS. 16A and 16B is a schematic diagram of a measurement circuit of a resistive input system according to a fifth embodiment of the present invention.
Figure 16B:
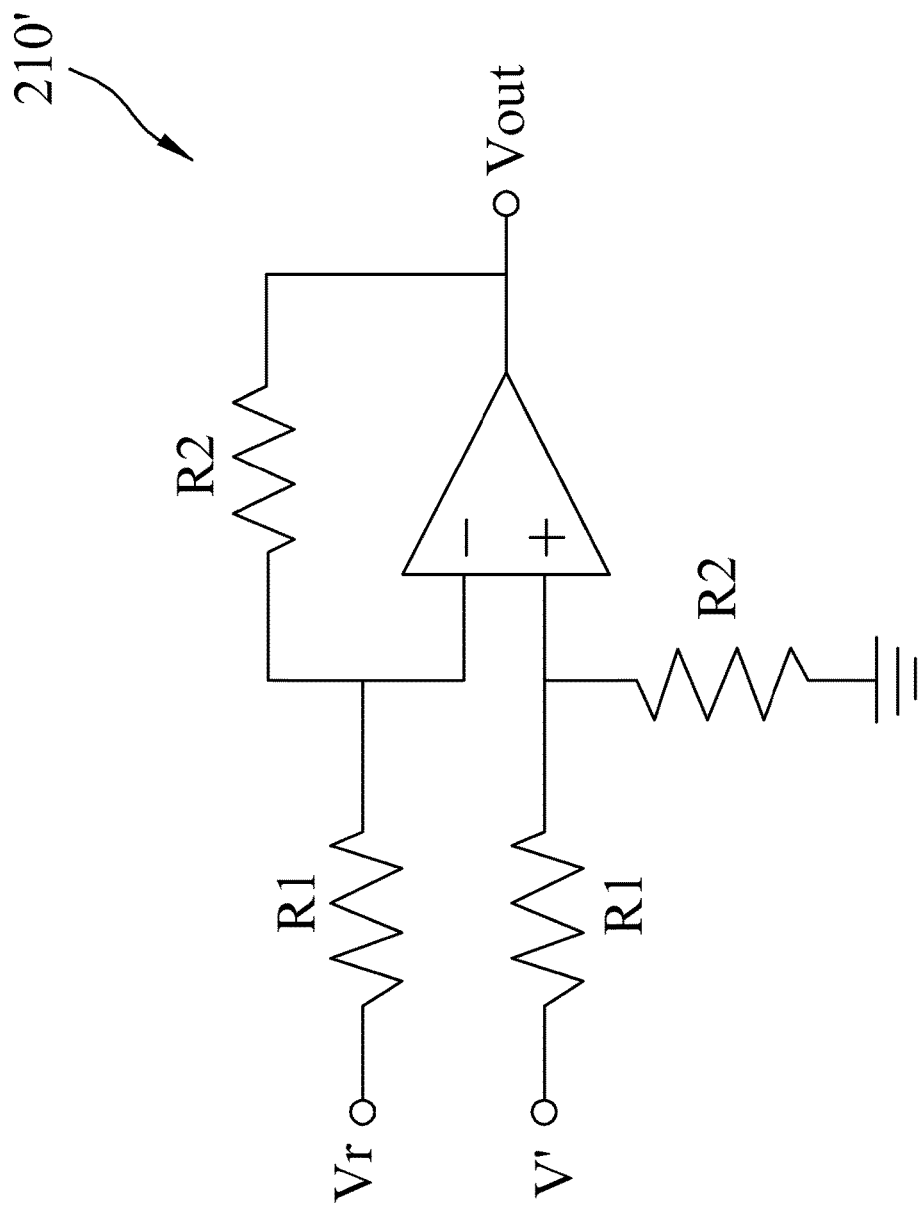

Please refer to FIG. 16A-16B, which are a schematic diagram of a measurement circuit of a resistive input system according to a fifth embodiment of the present invention. In FIG. 16A, the first measurement circuit 200 may include a voltage adjustment circuit 210 coupled between a MUX 220 and an ADC 230, the MUX 220 is coupled to the N second traces (e.g., the MUX 220 is coupled to 3 second traces in FIG. 15) and selects one of the second traces to be the scanned second trace. The adjustment circuit 210 then adjusts the first voltage level from the scanned second trace to a working range for the ADC 230, and the ADC 230 converts the adjusted first voltage level to a digital signal for the processor 300. The voltage adjustment circuit 210 may be realized by one or more op amp circuits, or other amplifier circuits, and the op amp circuit utilized here is configured for buffering the voltage or the current inputted therein, such as the first voltage level mentioned above. In some embodiments, the voltage adjust circuit 210 may be further coupled to the processor 300, and inform the processor 300 the used amplification factor in order to facilitate the processor to calculate the original first voltage level. In detail, the adjustment circuit 210 may be implemented as the adjustment circuit 210' shown in FIG. 16B, the adjustment circuit 210' may adjust the first voltage level, i.e., V' in FIG. 16B from the scanned second trace to a working range for the ADC 230, and the resistors R1 and R2 may be fixed or adjustable, and the voltage Vr may be the second voltage V2, therefore the output voltage Vout may be calculated by following equation:

$$Vout = \frac{V' - Vr}{R1} * R2$$

By setting the adjustment circuit 210', the first voltage level may further be precisely adjusted to the working range for the ADC 230.

In a preferred embodiment, the processor may be coupled to the first power control circuit and the first measurement circuit, and a threshold value may be set in the processor, wherein when a different between the first voltage level and the first voltage is smaller than the threshold voltage, the processor controls the first power circuit and the first measurement circuit to skip the following scanning process on the scanned second trace. That is, the processor may dynamically control the scanning process.

In such embodiments, when there is no input signal applied on the area corresponding to the variable resistor, the resistance of the variable resistor becomes vary large. Therefore, the two ends of the variable resistor are equivalent to an open loop. For convenience of explanation, please refer to FIG. 1 and FIG. 3, though other embodiments of the present invention may apply the described scanning method as well. A threshold voltage Vth is set in the processor 300, and the processor 300 is connected to the first power control circuit 100 and the first measurement circuit 200. Initially, the first power control circuit 100 provides the first voltage V1 on the first trace 111 and the second voltage V2 on the other first traces 112 and 113, and the first measurement circuit 200 scans the second trace 121 and receives the first voltage level $Va_1$ from the second trace 121. If there is no input signal at the areas corresponding to the variable resistors R112 and R113, the resistances of the variable resistor R112 and R113 become large. Therefore, as shown in FIG. 3, the first measurement circuit 200 is equivalently open-looped from where the second voltage V2 are applied, and the received first voltage level Va1 may be near the first voltage V1. Please refer to equation (1), this phenomenon can be expressed in equation as follows:

$$Va1 = \lim_{R_{112}, R_{113} \to \infty} \frac{R_{112}R_{113}}{R_{111}R_{112} + R_{111}R_{113} + R_{112}R_{113}}(V1 - V2) + V2 = V1 \quad (13)$$

Hence, there can be a threshold voltage Vth set in the processor 300. If the condition |Va1−V1|<Vth is satisfied, the processor 300 determines that there is no input signal or the input signal is not significant enough at the areas corresponding to the variable resistors R112 and R113. Under this circumstance, the processor 300 may control the first power control circuit 100 and the first measurement circuit 200 so that the first power control circuit 200 skips the scanning process of applying the first voltage V1 on the first traces 112 and 113 in respect to the scanned second trace 121 and the first measurement circuit 300 may start to measure the first voltage level Vb on the next second trace 122. In summary, by the scanning method provided in this embodiment, the scanning efficiency can be further improved and the scanning time can be further reduced.

Figure 17:
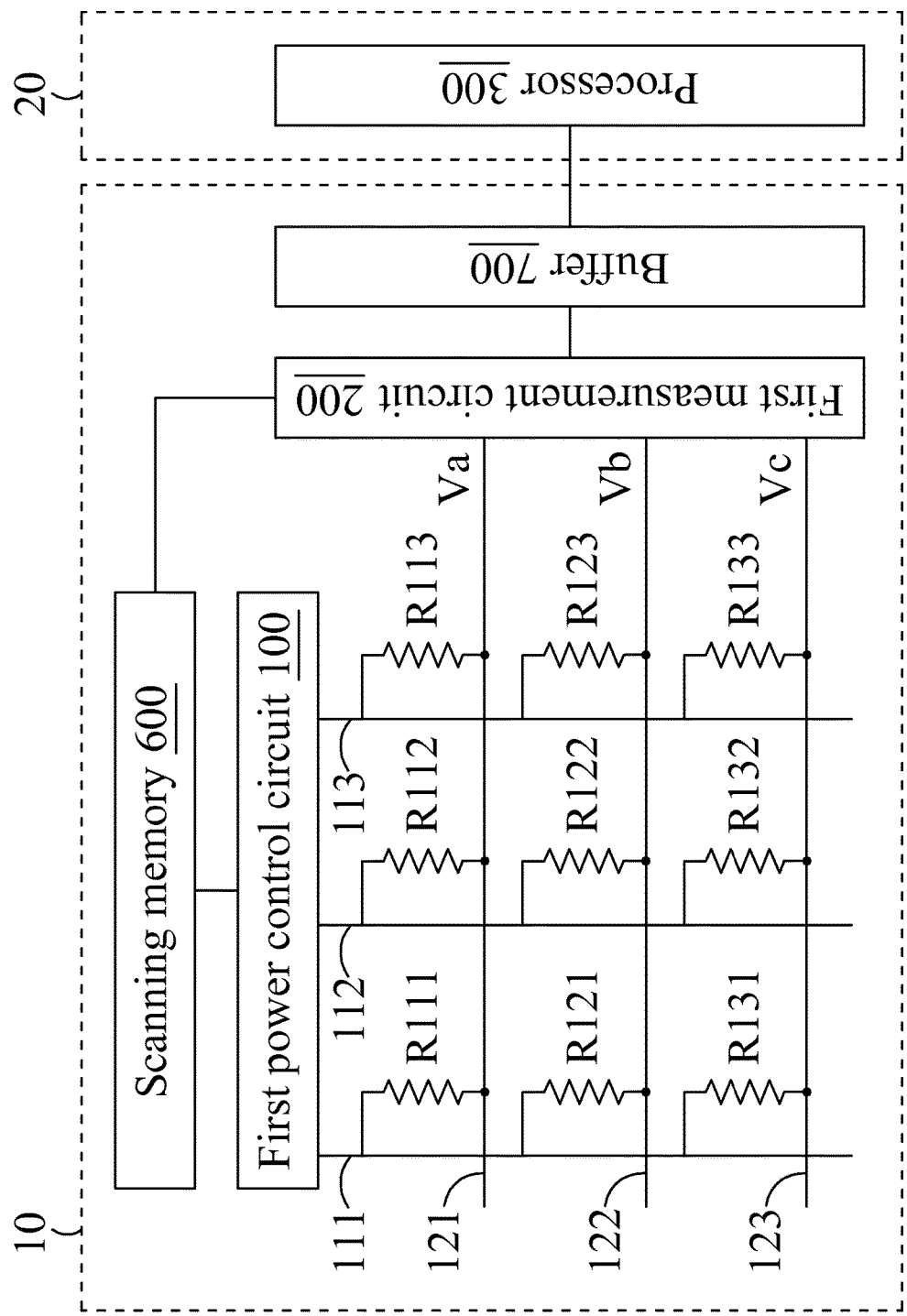
FIG. 17 is a schematic diagram of a resistive input system according to a sixth embodiment of the present invention.

Please refer to FIG. 17, which is a schematic diagram of a resistive input system according to a sixth embodiment of the present invention. In FIG. 17, the first power control circuit 100, the resistor matrix, and the first measurement circuit 200 may be disposed in a first device 10, and the processor 300 may be disposed in a second device 20 electrically connected to the first device 10. The first device 10 includes a scanning memory 600 storing a predetermined order and coupled to the first power control circuit 100 and the first measurement circuit 200, and the first power control circuit 100 and the first measurement circuit 200 scan the resistor matrix in the predetermined order.

To further reduce the manufacture cost of input device and improve the design flexibility, the processor 300 may be disposed in another device rather than the input device. Here, the input device is the first device 10, and the device in which the processor 300 is disposed is the second device 20. For example, if the variable resistors in the resistor matrix are FSRs, the first device 10 can be an external touch panel, and the second device 20 may be a computer or a smart device electrically connected to the external touch panel. Since the first power control circuit 100 and the first measurement circuit 200 have to follow a certain scanning method to scan the resistor matrix, the predetermined order can be stored in the scanning memory. The scanning memory is connected both the first power control circuit 100 and the first measurement circuit 200 and the first power control circuit 100 and the first measurement circuit 200 follow the predetermined order to scan the resistor matrix. Furthermore, the first device 10 may include a buffer 700, the information received by the first measurement circuit 200 (such as the first voltage levels) may be stored in the buffer 700, and then sent to the processor 300 disposed in the second device 20 while in data transmission between the first device 10 and the second device 20. An application published by the manufacturer of the first device 10 may be installed in the processor 300, and the processor 300 implements the application to calculate the information from the first device 10.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A resistive input system, comprising:
a resistor matrix, comprising M first traces, N second traces, and M*N resistors, first ends of the resistors of a same column being coupled to one of the M first traces, second ends of the resistors of a same row being coupled to one of the N second traces, and M being integer greater than 1, and N being integer greater than and equal to 1, wherein the M*N resistors include variable resistors, and resistances of the variable resistors vary according to an input signal;
a first power control circuit, coupled to the M first traces and providing a first voltage to one of the M first traces and a second voltage to the rest of the M first traces;
a first measurement circuit, coupled to the N second traces and measuring variations of a first voltage level of each of the second traces while the first power control circuit provides the first voltage to the one of the M first traces and the second voltage to the rest of the M first traces;
a processor, coupled to the first measurement circuit and determining at least one input point of the resistive input system according to the variation of the first voltage level of each of the second traces, wherein the M*N resistors comprise M*N variable resistors;
a second power control circuit, coupled to the N second traces and providing a third voltage to one of the N first traces and a fourth voltage to the rest of the N second traces; and
a second measurement circuit, coupled to one of the M first trace and the processor and measuring variations of a second voltage level of the one of the M first traces while the second power control circuit provides the third voltage to the one of the N second traces and the fourth voltage to the rest of the N second traces.

2. The resistive input system of claim 1, wherein the first power control circuit further comprises a voltage adjustment element coupled to the processor, which adjusts at least one of the first voltage and the second voltage according to a control signal from the processor to adjust the variations of the first voltage level measured by the first measurement circuit.

3. The resistive input system of claim 2, wherein the first power control circuit further comprises a voltage adjustment circuit coupled to the processor, one of the first voltage and the second voltage is inputted into the voltage adjustment circuit to adjust a difference between the first voltage and the second voltage according to a control signal from the processor.

4. The resistive input system of claim 3, wherein one of the first voltage and the second voltage is inputted into the voltage adjustment circuit to be adjusted to one another according to the control signal from the processor.

5. The resistive input system of claim 1, wherein the M*N resistors comprise N reference resistors and (M−1)*N variable resistors, and each of the second traces is coupled to one of the reference resistors and (M−1) variable resistors of the variable resistors, respectively.

6. The resistive input system of claim 5, wherein the processor determines a magnitude of the input signal according to the variations of the first voltage level and resistance of the reference resistors.

7. The resistive input system of claim 6, wherein the variable resistors are force sensing resistors, and the input signal is touching force.

8. The resistive input system of claim 1, wherein the processor determines ratios of resistance of one variable resistor to that of another variable resistor according to the variations of the first voltage level and the second voltage level, and determines a relative magnitude distribution according to the ratios.

9. The resistive input system of claim 8, wherein the variable resistors are force sensing resistors, and the relative magnitude distribution is a relative touching force distribution.

10. A resistive input system, comprising:
a resistor matrix, comprising M first traces, N second traces, and M*N resistors, first ends of the resistors of a same column being coupled to one of the M first traces, second ends of the resistors of a same row being coupled to one of the N second traces, and M being integer greater than 1, and N being integer greater than and equal to 1, wherein the M*N resistors include variable resistors, and resistances of the variable resistors vary according to an input signal;

a first power control circuit, coupled to the M first traces and providing a first voltage to one of the M first traces and a second voltage to the rest of the M first traces;

a first measurement circuit, coupled to the N second traces and measuring variations of a first voltage level of each of the second traces while the first power control circuit provides the first voltage to the one of the M first traces and the second voltage to the rest of the M first traces;

a processor, coupled to the first measurement circuit and determining at least one input point of the resistive input system according to the variation of the first voltage level of each of the second traces, wherein the M*N resistors comprise M*N variable resistors; and a reference resistor, a first end of the reference resistor coupled to the first power control circuit, and a second end of the reference resistor coupled to the first measurement circuit, the reference resistor electrically coupled to one of the second traces measured by the first measurement circuit and isolated from the rest of the second traces, wherein the first power control circuit provides the first voltage to one of the reference resistor and the M first traces and the second voltage to the rest of the reference resistor and the M first traces, and wherein the first measurement circuit measures variations of the first voltage level of each of the second traces while the first power control circuit provides the first voltage to one of the reference resistor and the M first traces and the second voltage to the rest of the reference resistor and the M first traces.

11. The resistive input system of claim 10, wherein the processor determines ratios of resistance of the reference resistor to that of each of the variable resistors according to the variations of the first voltage level, and determines a magnitude of the input signal according to the ratios.

12. The resistive input system of claim 11, wherein the variable resistors are force sensing resistors, and the input signal is touching force.

13. The resistive input system of claim 11, wherein the reference resistor and the variable resistors are made of the same material and a predetermined input signal is applied on the reference resistor.

14. The resistive input system of claim 13, wherein the variable resistors and the reference resistor are force sensing resistors, and the predetermined input signal is a predetermined force.

15. A resistive input system, comprising:
a resistor matrix, comprising M first traces, N second traces, and M*N resistors, first ends of the resistors of a same column being coupled to one of the M first traces, second ends of the resistors of a same row being coupled to one of the N second traces, and M being integer greater than 1, and N being integer greater than and equal to 1, wherein the M*N resistors include variable resistors, and resistances of the variable resistors vary according to an input signal;

a first power control circuit, coupled to the M first traces and providing a first voltage to one of the M first traces and a second voltage to the rest of the M first traces;

a first measurement circuit, coupled to the N second traces and measuring variations of a first voltage level of each of the second traces while the first power control circuit provides the first voltage to the one of the M first traces and the second voltage to the rest of the M first traces;

a processor, coupled to the first measurement circuit and determining at least one input point of the resistive input system according to the variation of the first voltage level of each of the second traces, wherein the M*N resistors comprise M*N variable resistors;

a selective circuit, coupled to the first power control circuit; and a plurality of reference resistors, having different resistances, each of the reference resistors coupled to the selective circuit and the first measurement circuit, wherein the selective circuit selects one of the reference resistors and the selected reference resistor is coupled to the first power control circuit and one of the second traces measured by the first measurement circuit, and is isolated from the rest of the second traces, wherein the first power control circuit provides the first voltage to one of the selective circuit and the M first traces and the second voltage to the rest of the selective circuit and the M first traces, and wherein the first measurement circuit measures variations of the first voltage level of each of the second traces while the first power control circuit provides the first voltage to one of the selective circuit and the M first traces and the second voltage to the rest of the selective circuit and the M first traces.

16. The resistive input system of claim 15, wherein the processor determines ratios of resistance of the one of the reference resistors to that of each of the variable resistors according to the variations of the first voltage level, and determines a magnitude of the input signal according to the ratios.

17. The resistive input system of claim 16, wherein the variable resistors are force sensing resistors, and the input signal is touching force.

18. The resistive input system of claim 15, wherein the first measurement circuit comprises a voltage adjustment circuit and an analog-to-digital convertor, the voltage adjustment circuit is coupled to the scanned second trace and adjusts the first voltage level from the scanned second trace to a working range for the analog-to-digital convertor, and the analog-to-digital convertor is coupled to the voltage adjustment circuit and converts the adjusted first voltage level to a digital signal for the processor.

19. The resistive input system of claim 18, wherein the voltage adjustment circuit comprises an op amp circuit.

20. The resistive input system of claim 15, wherein the first power control circuit, the resistor matrix, and the first measurement circuit are disposed in a first device, and the processor is disposed in a second device electrically connected to the first device, wherein the first device comprises a scanning memory storing a predetermined order and coupled to the first power control circuit and the first measurement circuit, and the first power control circuit and the first measurement circuit scan the resistor matrix in the predetermined order.

* * * * *